(12) United States Patent
Hiroki

(10) Patent No.: US 9,807,875 B2
(45) Date of Patent: Oct. 31, 2017

(54) ELECTRONIC DEVICE

(71) Applicant: Semiconductor Energy Laboratory Co., Ltd., Atsugi-shi, Kanagawa-ken (JP)

(72) Inventor: Masaaki Hiroki, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 99 days.

(21) Appl. No.: 14/844,368

(22) Filed: Sep. 3, 2015

(65) Prior Publication Data

US 2016/0073519 A1 Mar. 10, 2016

(30) Foreign Application Priority Data

Sep. 5, 2014 (JP) ................. 2014-180889

(51) Int. Cl.
| | |
|---|---|
| *H05K 5/00* | (2006.01) |
| *H05K 5/06* | (2006.01) |
| *H05K 1/02* | (2006.01) |
| *G06F 1/16* | (2006.01) |
| *H02J 7/02* | (2016.01) |
| *H05K 1/14* | (2006.01) |

(52) U.S. Cl.
CPC ............ *H05K 1/0274* (2013.01); *G06F 1/16* (2013.01); *G06F 1/163* (2013.01); *G06F 1/1652* (2013.01); *G06F 1/1656* (2013.01); *H02J 7/025* (2013.01); *H05K 1/147* (2013.01); *H05K 2201/0108* (2013.01); *H05K 2201/10128* (2013.01); *H05K 2201/2018* (2013.01)

(58) Field of Classification Search
None
See application file for complete search history.

(56) References Cited

U.S. PATENT DOCUMENTS

| | | |
|---|---|---|
| 6,599,659 B1 | 7/2003 | Endo et al. |
| 6,664,005 B2 | 12/2003 | Kezuka et al. |
| 7,764,046 B2 | 7/2010 | Osada |
| 7,944,172 B2 | 5/2011 | Osada |

(Continued)

FOREIGN PATENT DOCUMENTS

| | | |
|---|---|---|
| JP | 58-197655 A | 11/1983 |
| JP | 59-189554 A | 10/1984 |

(Continued)

OTHER PUBLICATIONS

Specification U.S. Appl. No. 29/486,857, filed Apr. 3, 2014, 9 pages.

*Primary Examiner* — Ashok Patel
(74) *Attorney, Agent, or Firm* — Fish & Richardson P.C.

(57) ABSTRACT

A novel electronic device is provided. Alternatively, an electronic device of a novel embodiment is provided. Alternatively, a sturdy electronic device is provided. The electronic device includes a housing and a display portion having flexibility. The housing includes a first board, a second board, and a sealing portion. The first board has a light-transmitting property. The first board and the second board face each other. The sealing portion is between the first board and the second board. The first board has a first curved surface which forms the inside of the housing. The display portion includes a region in contact with the first curved surface.

18 Claims, 27 Drawing Sheets

(56) References Cited

U.S. PATENT DOCUMENTS

| | | |
|---|---|---|
| 8,040,456 B2 | 10/2011 | Yamazaki et al. |
| 8,192,863 B2 | 6/2012 | Best et al. |
| 8,218,105 B2 | 7/2012 | Yamazaki et al. |
| 8,319,725 B2 | 11/2012 | Okamoto et al. |
| 8,367,440 B2 | 2/2013 | Takayama et al. |
| 8,415,208 B2 | 4/2013 | Takayama et al. |
| 8,427,420 B2 | 4/2013 | Yamazaki et al. |
| 8,634,041 B2 | 1/2014 | Yamazaki et al. |
| 8,785,030 B2 | 7/2014 | Ueda |
| 8,847,556 B2 | 9/2014 | Osada |
| 8,852,796 B2 | 10/2014 | Kim |
| 2005/0088365 A1 | 4/2005 | Yamazaki et al. |
| 2005/0189906 A1 | 9/2005 | Sun |
| 2009/0071952 A1 | 3/2009 | Kuwabara |
| 2010/0239907 A1 | 9/2010 | Izumi |
| 2011/0007042 A1* | 1/2011 | Miyaguchi ........ G02F 1/133305 345/204 |
| 2012/0200545 A1* | 8/2012 | Takahashi ............ H05K 1/118 345/204 |
| 2012/0202101 A1 | 8/2012 | Ueda |
| 2012/0244408 A1 | 9/2012 | Huang et al. |
| 2013/0134051 A1 | 5/2013 | Takahashi et al. |
| 2013/0177798 A1 | 7/2013 | Ueda |
| 2013/0181955 A1 | 7/2013 | Okamoto et al. |
| 2013/0214324 A1 | 8/2013 | Takayama et al. |
| 2013/0224562 A1 | 8/2013 | Momo |
| 2013/0252065 A1 | 9/2013 | Ueda |
| 2013/0252088 A1 | 9/2013 | Kuriki et al. |
| 2013/0252089 A1 | 9/2013 | Kuriki |
| 2013/0273405 A1 | 10/2013 | Takahashi et al. |
| 2013/0314346 A1 | 11/2013 | Yamazaki et al. |
| 2015/0022957 A1 | 1/2015 | Hiroki et al. |
| 2015/0111088 A1 | 4/2015 | Hiroki et al. |
| 2016/0094079 A1 | 3/2016 | Hiroki et al. |
| 2016/0157372 A1* | 6/2016 | Hiroki ................. G06F 1/1652 361/748 |

FOREIGN PATENT DOCUMENTS

| | | |
|---|---|---|
| JP | 07-006771 A | 1/1995 |
| JP | 10-326602 A | 12/1998 |
| JP | 2000-173559 A | 6/2000 |
| JP | 2000-285904 A | 10/2000 |
| JP | 2001-052762 A | 2/2001 |
| JP | 2001-093581 A | 4/2001 |
| JP | 2001-102090 A | 4/2001 |
| JP | 2003-174153 A | 6/2003 |
| JP | 2005-129393 A | 5/2005 |
| JP | 2005-332591 A | 12/2005 |
| JP | 2006-331874 A | 12/2006 |
| JP | 2007-066619 A | 3/2007 |
| JP | 2007-234466 A | 9/2007 |
| JP | 2009-016275 A | 1/2009 |
| JP | 2010-135231 A | 6/2010 |
| JP | 2010-282181 A | 12/2010 |
| JP | 2010-282183 A | 12/2010 |
| JP | 2011-060576 A | 3/2011 |
| JP | 2013-048041 A | 3/2013 |
| JP | 2013-048042 A | 3/2013 |

* cited by examiner

ELECTRONIC DEVICE

BACKGROUND OF THE INVENTION

1. Field of the Invention

The present invention relates to an electronic device, a display device, a light-emitting device, a power storage device, a driving method thereof, and a manufacturing method thereof.

Note that electronic devices in this specification mean all devices which operate by being supplied with electric power, and electronic devices including power sources, electronic devices and electro-optical devices including power sources such as storage batteries, information terminal devices including storage batteries, and the like are all electronic devices. Note that one embodiment of the present invention is not limited to the above technical field. The technical field of one embodiment of the invention disclosed in this specification and the like relates to an object, a method, and a manufacturing method. In addition, one embodiment of the present invention relates to a process, a machine, manufacture, and a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for driving any of them, and a method for manufacturing any of them.

2. Description of the Related Art

Display devices used while being worn on human bodies, such as display devices mounted on heads, have recently been developed and are referred to as head-mounted displays or wearable displays. It is desired that electronic devices used while being worn on human bodies, such as hearing aids, have a light weight and a small size.

Along with a decrease in weight of electronic devices, it is demanded that storage batteries included in electronic devices also have a light weight and a small size.

Electronic books including flexible display devices are disclosed in Patent Documents 1 and 2.

REFERENCE

Patent Documents

[Patent Document 1] Japanese Published Patent Application No. 2010-282181
[Patent Document 2] Japanese Published Patent Application No. 2010-282183

SUMMARY OF THE INVENTION

In order that a user can comfortably wear a display device used while being worn on a human body, the display device needs to have a light weight and a small size, and in addition, the whole electronic device including a driver device for the display device and a power source needs to have a light weight.

Furthermore, a display device used while being worn on a human body and an electronic device including the display device need to be easily carried around and to be sturdy.

When the display device and an electronic device including the display device are worn on a human body and removed therefrom repeatedly, external stress such as bending is repeatedly applied to them. Consequently, a display portion, an external portion, a power storage device included in the display device or the electronic device, or the like is broken in some cases.

An object of one embodiment of the present invention is to provide a novel electronic device. Another object of one embodiment of the present invention is to provide an electronic device of a novel embodiment. Another object of one embodiment of the present invention is to provide a sturdy electronic device.

Another object of one embodiment of the present invention is to provide a novel display device. Another object of one embodiment of the present invention is to provide a display device of a novel embodiment. Another object of one embodiment of the present invention is to provide a sturdy display device.

Another object of one embodiment of the present invention is to provide an electronic device used while being worn on a human body. Another object of one embodiment of the present invention is to provide an electronic device used while being worn on an arm.

Another object of one embodiment of the present invention is to provide a display device used while being worn on a human body. Another object of one embodiment of the present invention is to provide a display device used while being worn on an arm.

Another object of one embodiment of the present invention is to provide a power storage device used while being worn on part of a human body. Another object of one embodiment of the present invention is to provide a power storage device used while being worn on an arm.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is an electronic device including a housing and a display portion having flexibility.

The housing includes one or a plurality of components. The housing is, for example, a structural member.

Here, the housing may include an opening in its part.

An electronic device of one embodiment of the present invention is preferably worn on an arm of a user. The electronic device of one embodiment of the present invention includes a housing, a first board, a second board, and a sealing portion. The first board has a light-transmitting property. The first board and the second board face each other. The sealing portion is between the first board and the second board. The first board has a first curved surface which forms the inside of the housing. The display portion includes a region in contact with the first curved surface. The electronic device of one embodiment of the present invention is preferably worn such that the second board is in contact with the arm of the user.

Alternatively, an electronic device of one embodiment of the present invention includes a first board, a second board, a sealing portion, and a display portion having flexibility. The first board has a light-transmitting property. The first board and the second board face each other. The sealing portion is between the first board and the second board. The first board has a first curved surface which forms the inside of the housing. The display portion includes a region in contact with the first curved surface.

In any of the above structures, the first board, the second board, and the sealing portion are preferably flexible. Furthermore, in any of the above structures, part of the sealing portion preferably has a surface which is substantially continuous with a surface of the second board, in which the surface of the second board forms the outside of the housing.

In any of the above structures, the sealing portion preferably includes a resin. In any of the above structure, the sealing portion preferably has higher elasticity than the first board. In any of the above structures, the sealing portion preferably has higher rigidity than the first board. In any of the above structures, the sealing portion preferably has higher flexibility than the first board.

In any of the above structures, the electronic device preferably further includes a power storage device in the housing, and the power storage device preferably includes a region in contact with the second board. In any of the above structures, the electronic device preferably further includes a third board between the power storage device and the display portion.

According to one embodiment of the present invention, a novel electronic device can be provided. According to one embodiment of the present invention, an electronic device of a novel embodiment can be provided. According to one embodiment of the present invention, a sturdy electronic device can be provided.

According to one embodiment of the present invention, a novel display device can be provided. According to one embodiment of the present invention, a display device of a novel embodiment can be provided. According to one embodiment of the present invention, a sturdy display device can be provided.

According to one embodiment of the present invention, an electronic device used while being worn on part of a human body can be provided. According to one embodiment of the present invention, an electronic device used while being worn on an arm can be provided.

According to one embodiment of the present invention, a power storage device used while being worn on part of a human body can be provided. According to one embodiment of the present invention, a power storage device used while being worn on an arm can be provided.

According to one embodiment of the present invention, a display device used while being worn on a human body can be provided. According to one embodiment of the present invention, a display device used while being worn on an arm can be provided.

Note that the description of these effects does not disturb the existence of other effects. One embodiment of the present invention does not necessarily achieve all the effects. Other effects will be apparent from and can be derived from the description of the specification, the drawings, the claims, and the like.

DETAILED DESCRIPTION OF THE INVENTION

Embodiments of the present invention will be described below in detail with reference to the drawings. However, the present invention is not limited to the description below, and it is easily understood by those skilled in the art that modes and details disclosed herein can be modified in various ways. Furthermore, the present invention is not construed as being limited to description of the embodiments.

(Embodiment 1)

In this embodiment, an example of an electronic device 100 that can be worn on part of a human body will be described.

Figure 1:
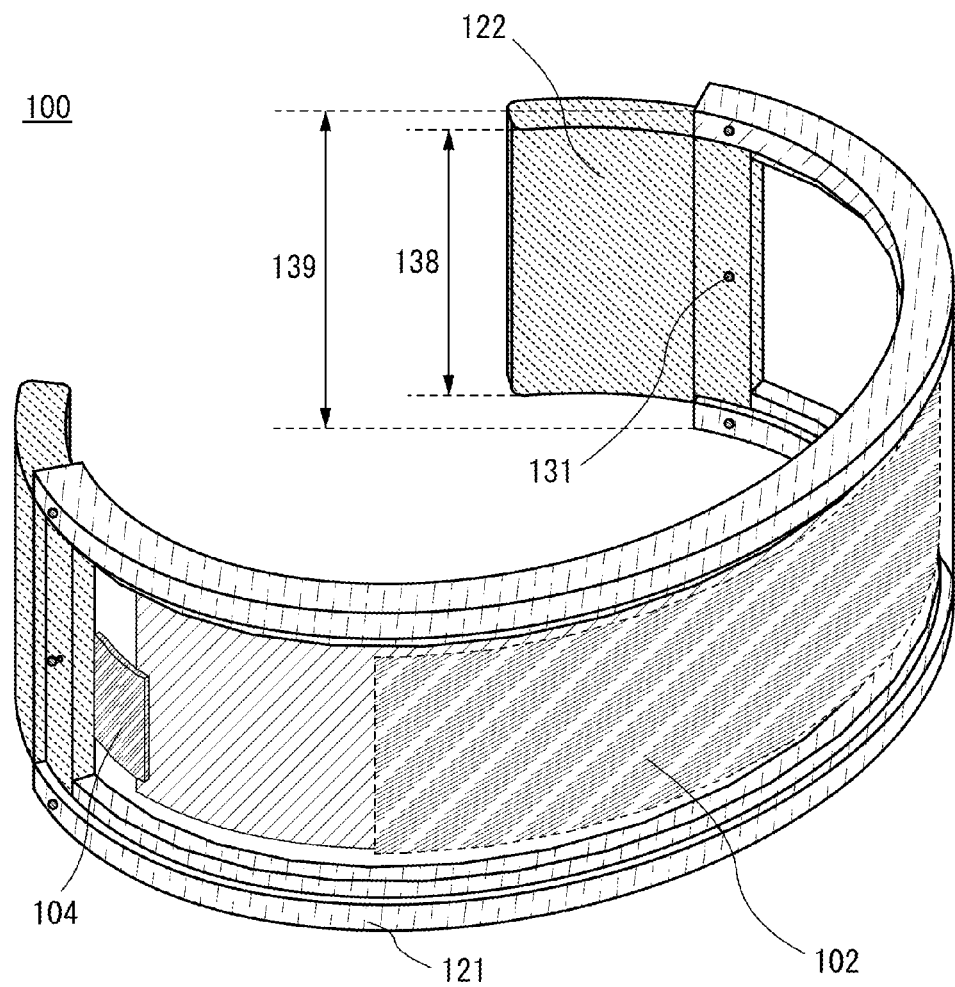
FIG. 1 is a perspective view of an electronic device of one embodiment of the present invention.
Figure 2A:
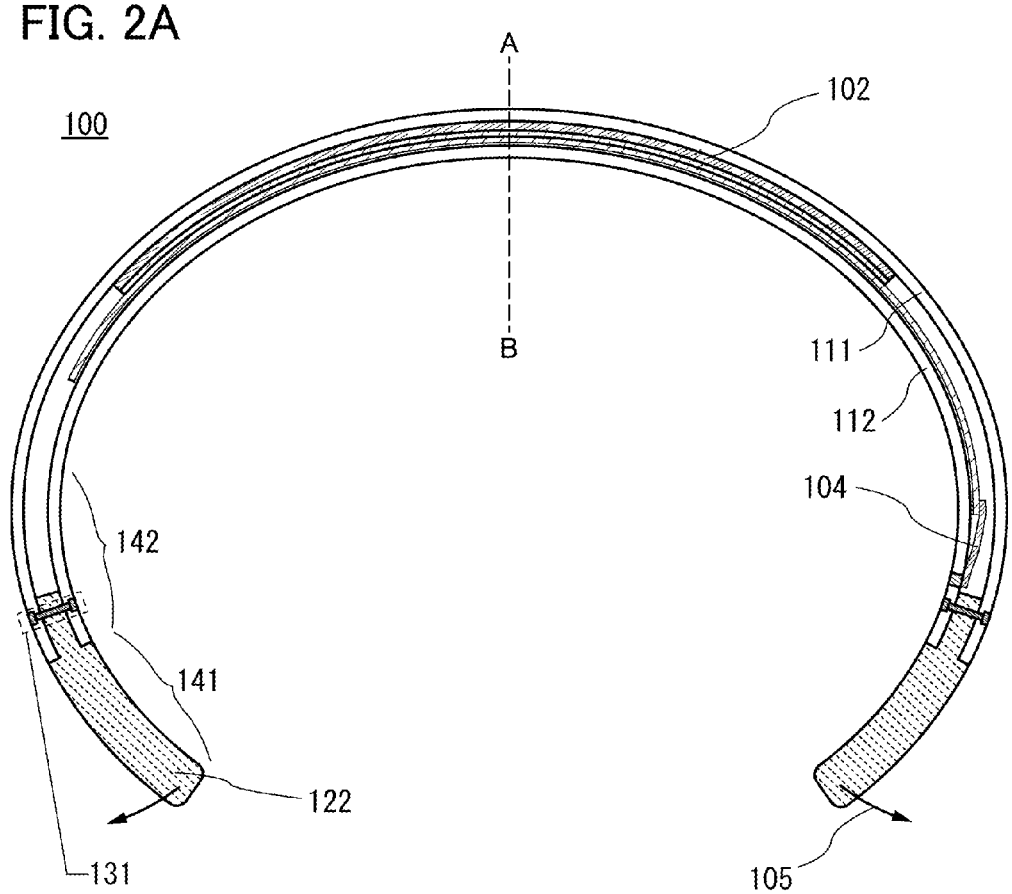
FIGS. 2A to 2C are cross-sectional views illustrating an electronic device of one embodiment of the present invention.
Figure 2B:
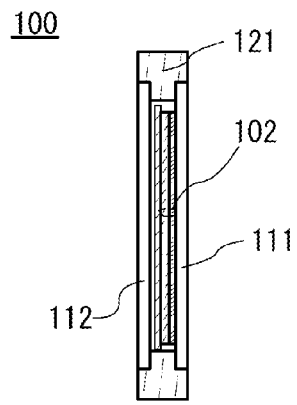

FIG. 1 is a perspective view of the electronic device 100. FIG. 2A illustrates a cross section of the electronic device 100 in FIG. 1, and FIG. 2B illustrates a cross section taken along the dashed line A-B in FIG. 2A. The electronic device 100 illustrated in FIG. 1 and FIGS. 2A to 2C includes a board 111, a board 112, two sealing portions 121, two sealing portions 122, and a display portion 102. The electronic device 100 preferably includes a first circuit board 104. Here, as the first circuit board 104, for example, a flexible printed circuit (FPC) in which a flexible resin film is provided with a wiring can be used.

The display portion 102 includes a display element over a flexible film.

The sealing portions 121 and the sealing portions 122 each include a portion (region) which is positioned between the board 111 and the board 112. The sealing portions 121 and the sealing portions 122 are each preferably in contact with the board 111 and the board 112.

Here, FIG. 2A shows an example of a cross section substantially parallel to the cross section of an arm in the case where the electronic device 100 is worn on the arm. The cross section of FIG. 2B includes the display portion 102, for example, and is perpendicular to the cross section of FIG. 2A. In the cross section of FIG. 2A, the sealing portions 122 each preferably include a portion (region) which is in contact with end portions of the board 111 and the board 112 and is positioned between the board 111 and the board 112. Furthermore, in the cross section of FIG. 2A, the sealing portions 122 may each cover the end portions of the board 111 and the board 112.

In the cross section of FIG. 2B, the sealing portions 121 each preferably include a portion which is in contact with end portions of the board 111 and the board 112 and is positioned between the board 111 and the board 112.

When the sealing portions 121 and the sealing portions 122 each include the portion which is positioned between the board 111 and the board 112, the distance between the board 111 and the board 112 can be kept and the whole structure of the electronic device 100 can be maintained. Furthermore, even in the case where the board 111, the board 112, and the like are deformed owing to external stress applied to the electronic device 100, they can easily return to their original shapes after the electronic device 100 is released from the external stress. In the example of FIG. 1, a width 138 of the sealing portions 122 is narrower than a width 139 of the electronic device 100; however, the width 138 of the sealing portions 122 may be substantially the same as the width 139 of the electronic device 100. When the width 138 and the width 139 are substantially the same, the end portions of the sealing portions 122 and the electronic device 100 can be continuous, and thus the electronic device 100 can fit a body more snugly in some cases.

Each of the board 111 and the board 112 preferably has a curved surface. Furthermore, each of the cross sections of the board 111 and the board 112 preferably has a circular shape or a circular arc shape, for example.

When the electronic device 100 is worn or removed, it is preferred that regions with a large radius of curvature in the cross sections of the board 111 and the board 112 be not substantially deformed and end portions in the cross sections of the board 111 and the board 112 be flexible. For example, the cross sections of the board 111 and the board 112 preferably have a C-like shape, an elliptical shape, or an elliptical shape part of which is cut. When the cross sections of the board 111 and the board 112 have such a round shape, the electronic device 100 can fit a body such as an arm more snugly. For example, in the case where the electronic device 100 is worn on an arm, the electronic device 100 can be put around the arm so as to fit the arm snugly. Note that the cross sections of the board 111 and the board 112 may have a rectangular shape such as a square-bracket shape.

For example, when the board 111 or the board 112 is formed using a resin such as plastic, chipping or cracking is likely to be generated in the end portion of the board in some cases. Furthermore, for example, when the board 111 and the board 112 are formed using a resin such as plastic to form a continuous housing, breaking is likely to be generated in the resin in some cases. Such a phenomenon is highly likely to occur dynamically when the board 111 or the board 112 is thin. The sealing property may be reduced due to the generation of chipping or cracking. The sealing property may be also reduced when a broken piece generated owing to chipping enters a region between the board and the sealing portion. In order to prevent such a phenomenon, the sealing portions 121 and 122 are provided; thus, impact applied from the outside to the board 111 or the board 112 can be reduced and generation of breaking, chipping, and cracking can be minimized. Consequently, the electronic device 100 can be sturdy and is unlikely to be broken.

The electronic device 100 preferably includes a display module. The display module includes the display portion 102. The display module preferably includes the circuit board 104 or a second circuit board. The circuit board 104 or the second circuit board preferably includes, for example, a driver circuit for driving the display portion. The display module is preferably provided with a converter circuit for feeding power from a power storage device.

Figure 11A:
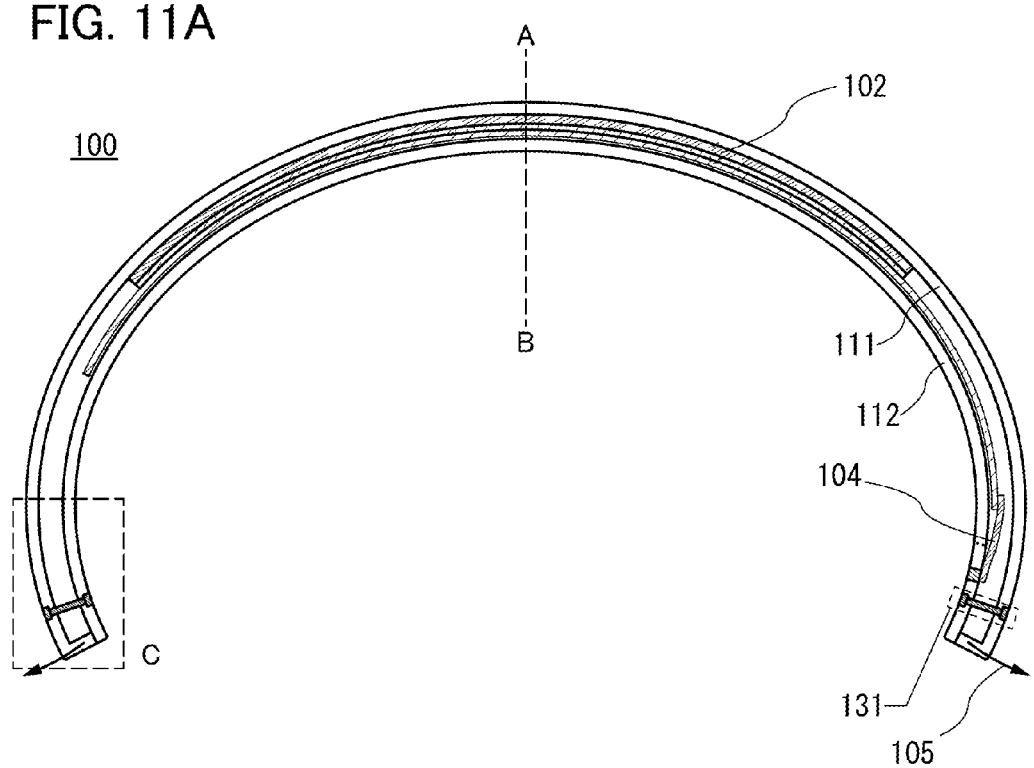
FIGS. 11A to 11D are cross-sectional views illustrating an electronic device of one embodiment of the present invention.
Figure 11B:
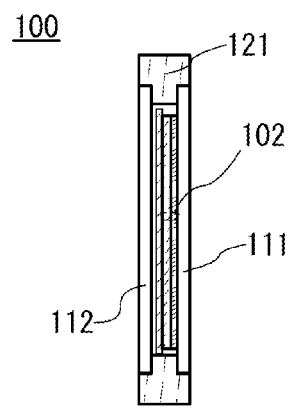
Figure 11C:
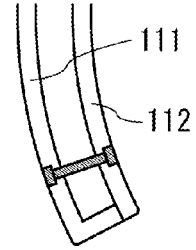

The electronic device 100 does not necessarily include the sealing portions 122. The electronic device 100 illustrated in FIGS. 11A to 11D includes the board 111, the board 112, the sealing portions 121, the display portion 102, and the circuit board 104. FIG. 11A illustrates a cross section of the electronic device 100, and FIG. 11B illustrates a cross section taken along the dashed line A-B in FIG. 11A. FIG. 11C is an enlarged view of a region C surrounded by the dashed line in FIG. 11A.

The electronic device 100 illustrated in FIGS. 11A to 11D preferably has a housing including the board 111, the board 112, and the sealing portions 121 in contact with the board 111 and the board 112. For example, as illustrated in FIG. 11A, the end portions of the board 111 are preferably bent into an L shape in the cross section in order to form the housing.

Figure 11D:
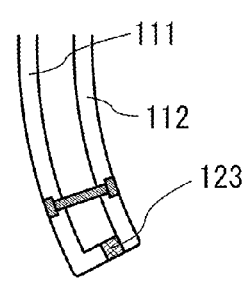

FIG. 11D is a modification example of FIG. 11C, in which a sealing portion 123 is provided between the board 111 and the board 112. By providing the sealing portion 123, the hermeticity of the housing including the board 111, the board 112, the sealing portions 121, and the sealing portion 123 can be further improved in some cases. Furthermore, when the board 111 and the board 112 are deformed by external stress, the sealing portions 121 and the sealing portion 123 relieve the external stress; thus, the whole structure of the electronic device 100 can be maintained.

Figure 12:
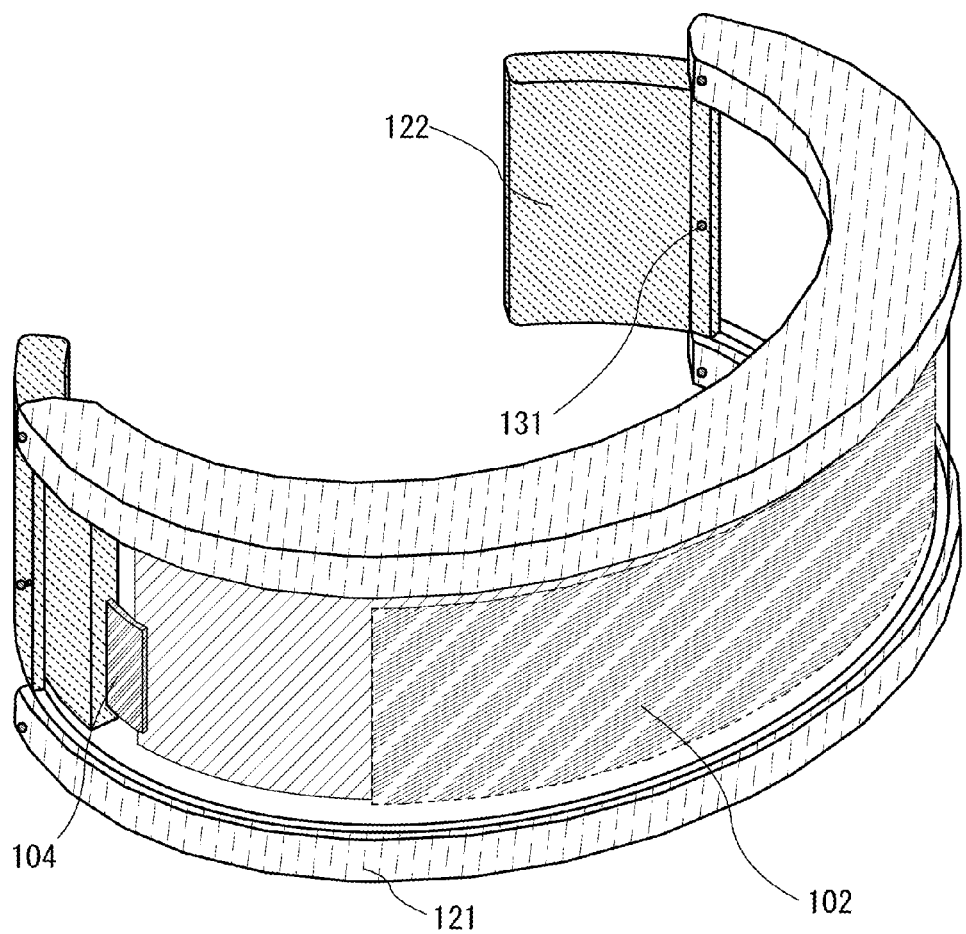
FIG. 12 is a perspective view illustrating an electronic device of one embodiment of the present invention.
Figure 13A:
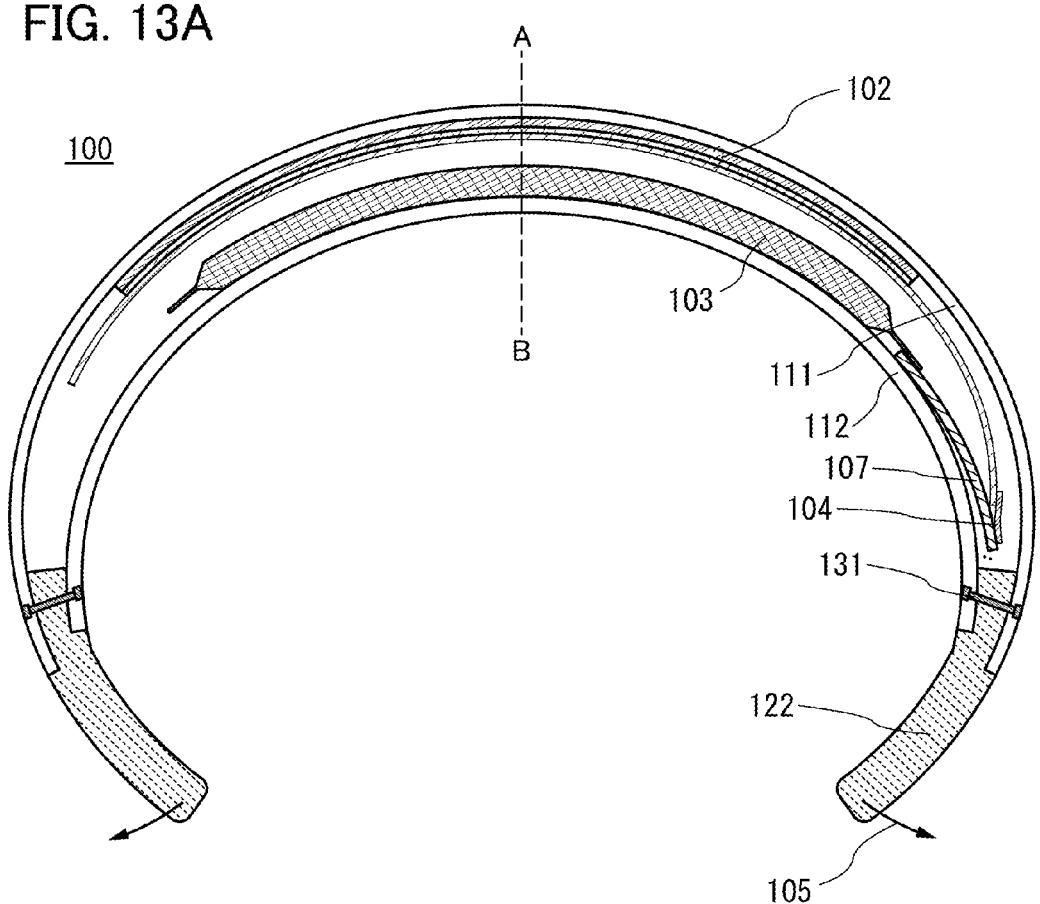
FIGS. 13A to 13C are cross-sectional views illustrating an electronic device of one embodiment of the present invention.
Figure 13B:
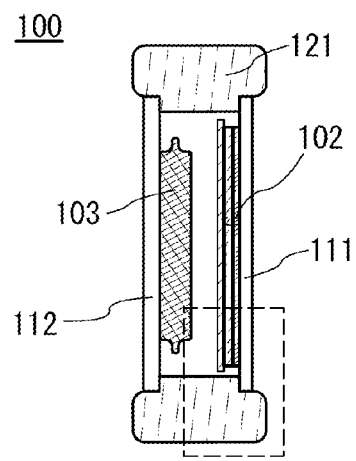
Figure 13C:
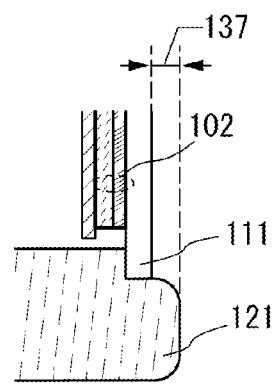

As illustrated in FIG. 12 and FIGS. 13A to 13C, the sealing portions 121 preferably include regions which are on the outer side than the surfaces of the board 111 and the board 112. FIG. 12 is a perspective view of the electronic device 100, and FIGS. 13A to 13C are cross-sectional views of the electronic device 100 illustrated in FIG. 12.

The electronic device 100 illustrated in FIGS. 13A to 13C includes the board 111, the board 112, the sealing portions 121, the sealing portions 122, the display portion 102, the circuit board 104, a power storage device 103, a circuit portion 107, and hinges 131. The power storage device 103 will be described in detail later. FIG. 13A illustrates a cross section of the electronic device 100. FIG. 13B illustrates a cross section taken along the dashed line A-B in FIG. 13A. FIG. 13C is an enlarged view of a region surrounded by the dashed line in FIG. 13B. As illustrated in FIG. 13C, the surface of the sealing portion 121 is on the outer side than the surface of the board 111 by a distance 137. When the surface of the sealing portion 121 is on the outer side than the surfaces of the board 111 and the board 112 in this manner, the surfaces of the board 111 and the board 112 are not in direct contact with a surface of a desk or the like in the case where the electronic device 100 is put on the desk or the like; thus, the board 111 and the board 112 are unlikely to be broken.

The electronic device 100 illustrated in FIG. 1 preferably has a housing including the board 111, the board 112, and the sealing portions 121 and 122 in contact with the boards 111 and 112. The hermeticity of the housing is preferably high. When the hermeticity of the housing is high, the water resistance of the electronic device 100 can be high, for example. Furthermore, a foreign substance can be prevented from entering the housing. Accordingly, the reliability of the electronic device 100 can be improved.

The electronic device 100 may include the hinges 131 for fixing the boards 111 and 112 to the sealing portions 121 or the sealing portions 122. As the hinges 131, for example, a screw can be used. Alternatively, as the hinges 131, for example, a ring may be used. For the hinges 131, a material such as a metal, a ceramic, or a resin can be used. As the metal, for example, stainless steel, magnesium, aluminum, or titanium can be used.

The electronic device 100 may be fixed by swaging the board 111 and the board 112. For example, the electronic device 100 may be fixed with the use of a rivet or the like by inserting screws into the holes provided in the board 111 and the board 112 and deforming (swaging) the screws.

Each of the board 111 and the board 112 preferably has a curved surface. When the board 111 and the board 112 have a curved surface, the electronic device 100 can have a shape corresponding to the shape of part of a body on which the electronic device 100 is worn; thus, the electronic device 100 can be easily worn on an arm or the like. Each of the board 111 and the board 112 preferably has flexibility. When each of the board 111 and the board 112 has flexibility, the electronic device 100 and the board 111, the board 112, and the like in the electronic device 100 can be prevented from being easily broken even in the case where the electronic device 100 is worn and removed repeatedly.

The board 111 preferably has a light-transmitting property. Examples of the board 111 include glass, quartz, plastic, a flexible board, an attachment film including a resin, paper including a fibrous material, and a base film. Examples of glass include barium borosilicate glass, aluminoborosilicate glass, and soda lime glass. Examples of a flexible board, an attachment film, and a base film include plastic typified by polyethylene terephthalate (PET), polyethylene naphthalate (PEN), polyether sulfone (PES) and polytetrafluoroethylene (PTFE); a synthetic resin such as acrylic; polypropylene; polyester; polyvinyl fluoride; polyvinyl chloride; polyamide; polyimide; aramid; epoxy; and an inorganic vapor deposition film.

For the board 112, any of the above materials for the board 111 can be used. Alternatively, for the board 112, a board including metal, stainless steel, or stainless steel foil, a board including tungsten or tungsten foil, paper, a semiconductor (such as a single crystal semiconductor or a silicon semiconductor), or the like may be used.

For the board 112, a material having higher rigidity than the board 111 may be used, for example. For the board 111, for example, a stainless steel material may be used. A stainless steel material serves as a protective material which prevents the display portion 102 and the power storage device 103 from being curved excessively or from being twisted and deformed significantly. A stainless steel material only allows a change into a certain shape, i.e., bending in one direction, in putting the electronic device on an arm, which improves the reliability.

Each of the sealing portions 121 and the sealing portions 122 preferably has elasticity. Furthermore, each of the sealing portions 121 and the sealing portions 122 preferably has flexibility.

Since the sealing portions 121 and the sealing portions 122 are provided, the electronic device 100 can be sturdier. For example, even when the electronic device 100 is made to collide with a substance which is harder than the board 111 and the board 112, the impact can be reduced. Here, the hard substance means, for example, a substance having high hardness.

Each of the sealing portions 121 and the sealing portions 122 preferably has higher elasticity than the board 111. A material having high elasticity means, for example, a material having low hardness. Each of the sealing portions 121 and the sealing portions 122 preferably has higher flexibility than the board 111.

The surfaces of the sealing portions 121 and the sealing portions 122 preferably have a higher coefficient of friction than the board 111 and the board 112. When the surfaces of the sealing portions 121 and the sealing portions 122 have a higher coefficient of friction, the electronic device 100 can be prevented from being broken by being dropped when carried around, worn on a body, or removed from a body, for example.

As the sealing portions 121 and the sealing portions 122, for example, a resin can be used. As a resin, for example, an elastomer can be used.

The sealing portions 121 and the sealing portions 122 may have bellows or a cut may be made in the sealing portions 121 and the sealing portions 122. The flexibility can be improved owing to bellows or a cut. For example, a metal having bellows can be used. Here, bellows refers to, for example, a structure with which an object can be elongated or contracted from/to a folded state. For example, a metal having bellows has a plurality of mountain-folded portions and valley-folded portions.

For example, as illustrated in FIG. 2A, surfaces 141 of the sealing portions 122 and a surface 142 of the board 112 are preferably continuous. Here, the term "continuous" means a state where a difference in level in a boundary portion is small or a state where unevenness in a boundary portion is small. When the electronic device 100 is worn on a body or the like, a surface of the sealing portions 121 or the sealing portions 122 in contact with part on which the electronic device 100 is worn is preferably continuous with a surface of the board 112 in contact with the part. The electronic device can fit a body or the like more snugly when these surfaces are continuous.

Figure 2C:
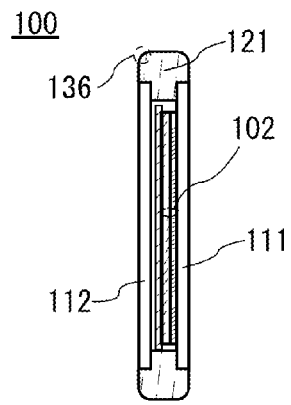

As illustrated in FIG. 2C, cross sections of the sealing portions 121 may have round shapes 136. When the cross sections of the sealing portions 121 have the round shapes 136, the electronic device can fit a body or the like more snugly in some cases.

At least part of the display portion 102 is preferably in contact with an inner surface of the board 111, that is, a surface forming the inside of the housing. The display portion 102 preferably is flexible. When the display portion 102 is flexible, the display portion 102 can easily have a shape corresponding to the shape of the inner surface of the board 111. Even in the case where the board 111 is deformed by external stress, the display portion 102 can be prevented from being degraded or broken.

Between the display portion 102 and the board 111, an adhesive resin may be provided. For example, an adhesive sheet may be attached to the board 111 and the display portion 102 may be attached to the adhesive sheet.

Figure 3A:
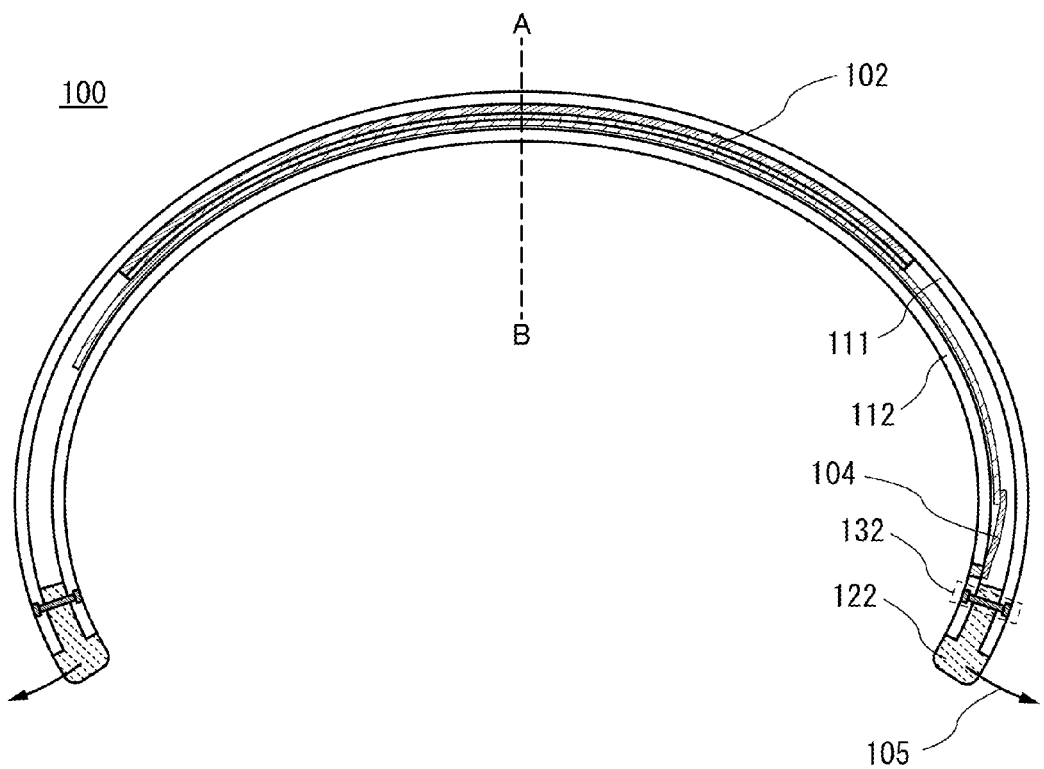
FIGS. 3A and 3B are cross-sectional views illustrating an electronic device of one embodiment of the present invention.
Figure 3B:
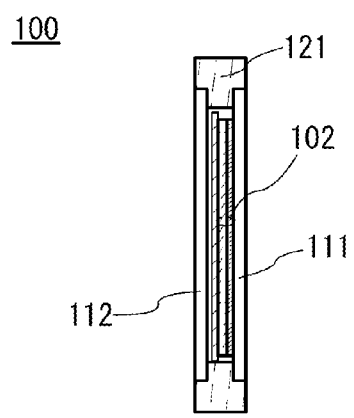

In the cross-sectional view of FIG. 2A, cross sections of the sealing portions 122 have elongated shapes along the board 111 and the board 112; however, as illustrated in FIG. 3A, the cross sections of the sealing portions 122 may have shapes which are not elongated. The sealing portions 121 and the sealing portions 122 may have a structure in which they can be detached from the housing. In the case where a circuit connected to the display portion 102, a power storage device, or the like is provided in the housing, attachment or replacement of the circuit, the power storage device, or the like can be performed easily when the sealing portions 121 and the sealing portions 122 can be detached from the housing.

Figure 4:
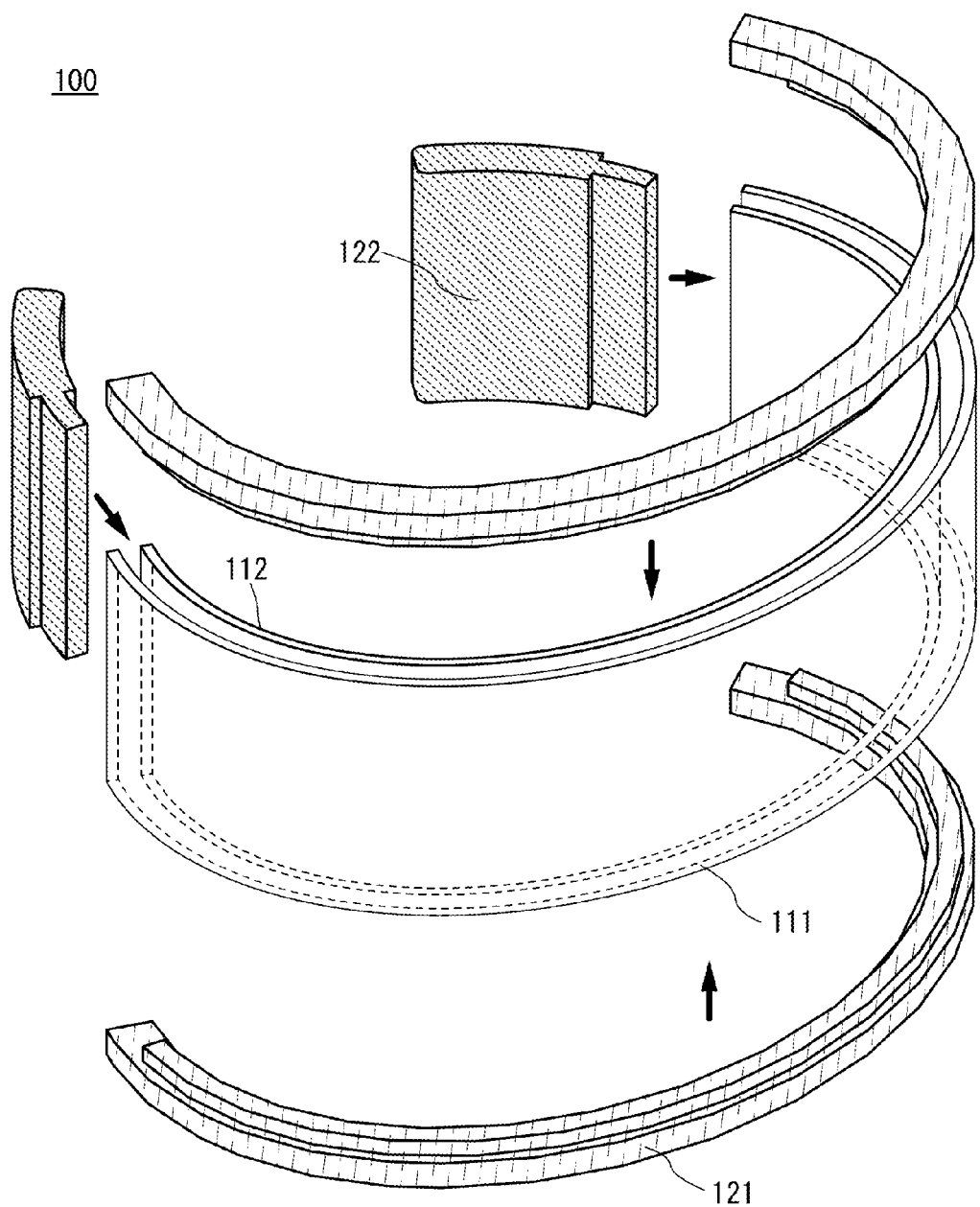
FIG. 4 is a perspective view illustrating a method for manufacturing an electronic device of one embodiment of the present invention.

A method for assembling the electronic device 100 illustrated in FIG. 1 will be described with reference to FIG. 4. In FIG. 4, the display portion 102, the circuit board 104, and the like are not illustrated for simplicity. The two sealing portions 121 are placed such that part of each of the sealing portions 121 is sandwiched between the board 111 and the board 112. In the example of FIG. 4, the two sealing portions 121 are provided in contact with two sides facing each other of the board 111 and the board 112. The two sealing portions 122 are placed such that part of each of the sealing portions 122 is sandwiched between the board 111 and the board 112. In the example of FIG. 4, the two sealing portions 122 are provided in contact with two sides which are not sealed by the sealing portions 121. Here, the sealing portions 121 and the sealing portions 122 may be fixed to the board 111 and the board 112 with the use of an adhesive or the like. For example, an adhesive sheet or the like is preferably used.

Next, although not illustrated, the boards 111 and 112 are fixed to the sealing portions 121 and the sealing portions 122 with the use of the hinges 131. When they can be sufficiently fixed in the above adhesive step, the hinges 131 are not necessarily provided in some cases.

Figure 5:
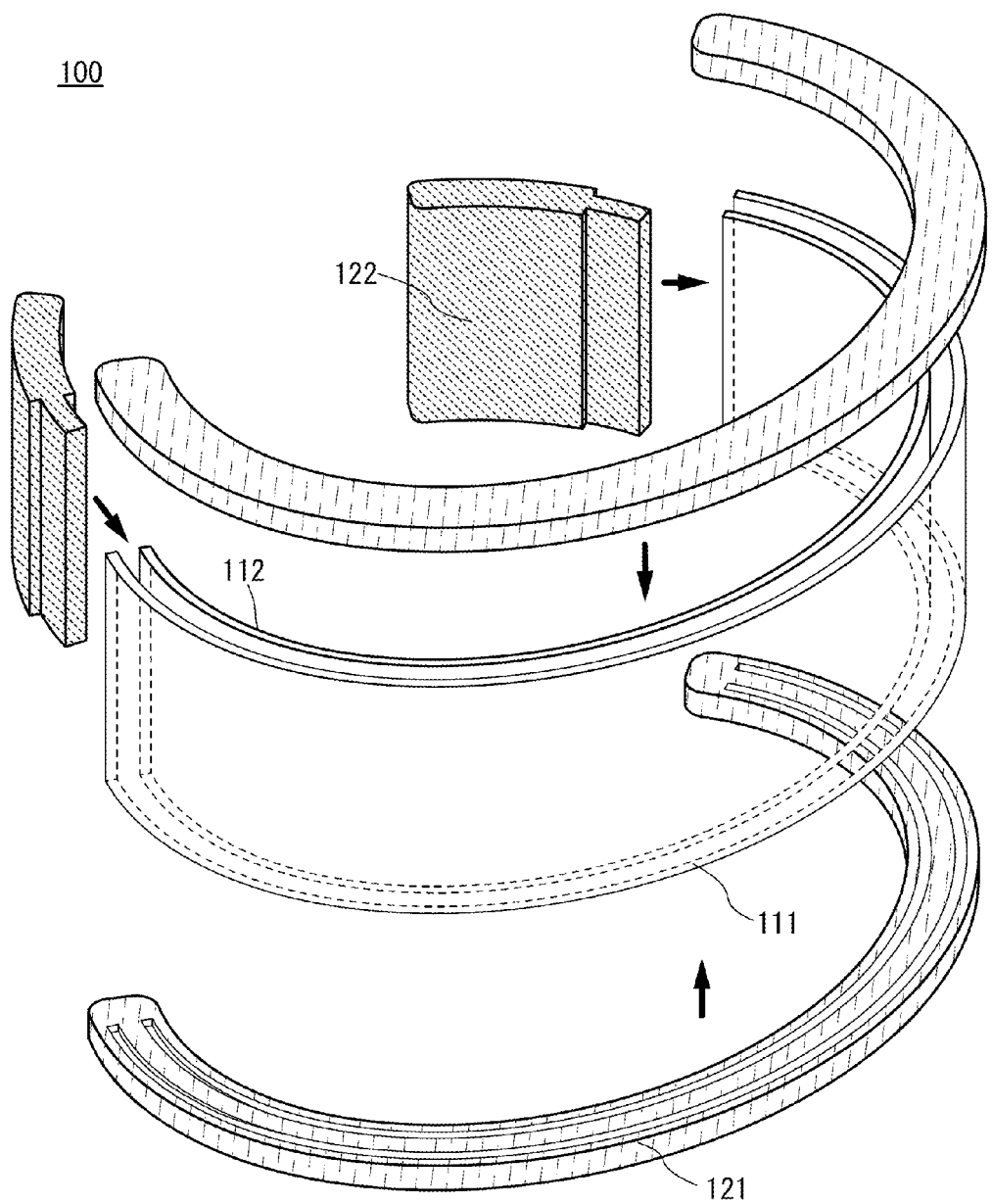
FIG. 5 is a perspective view illustrating a method for manufacturing an electronic device of one embodiment of the present invention.
Figure 6:
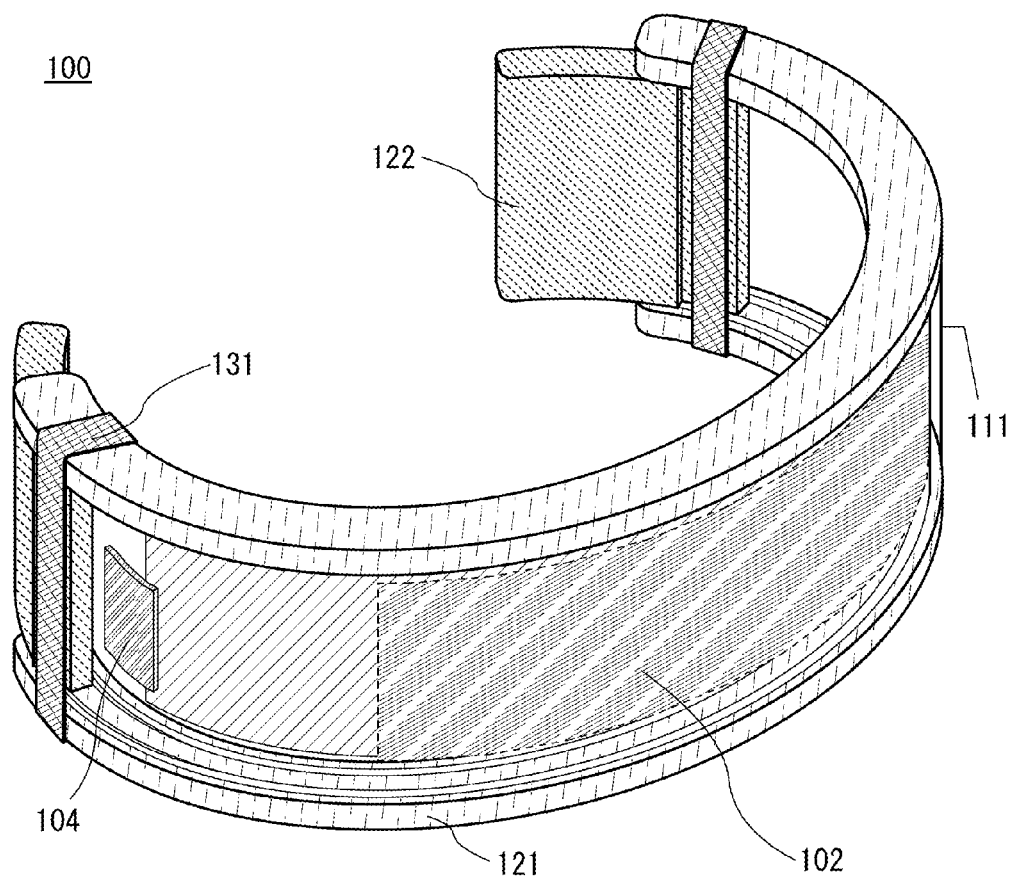
FIG. 6 is a perspective view illustrating an electronic device of one embodiment of the present invention.

Alternatively, as illustrated in FIG. 5, the board 111 and the board 112 may be put so as to fill grooves provided in the sealing portions 121. Also in such a structure, the sealing portions 121 each have a region which is positioned and sandwiched between the board 111 and the board 112. FIG. 6 is a perspective view of the electronic device 100 in the case where the grooves are provided in the sealing portions 121. In the example of FIG. 6, the ring-like (belt-like) hinges 131 are used.

Figure 7:
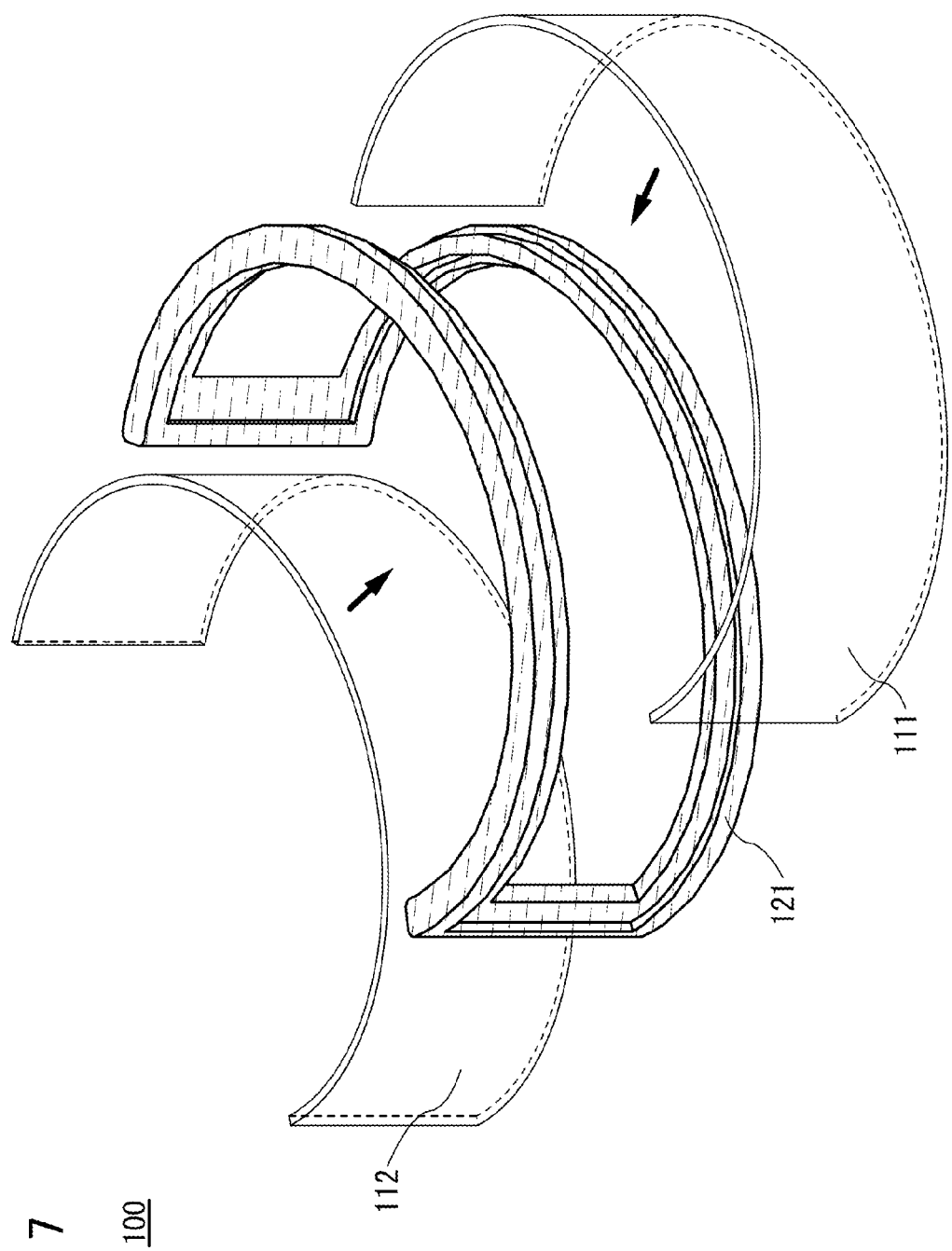
FIG. 7 is a perspective view illustrating a method for manufacturing an electronic device of one embodiment of the present invention.

The sealing portions 121 and the sealing portions 122 may be continuous. That is, the sealing portions 121 may serve also as the sealing portions 122. In the example of FIG. 7, the sealing portion 121 is provided so as to be in contact with all end faces, here, four sides of each of the board 111 and the board 112.

In the cross sections of the board 111 and the board 112 illustrated in FIG. 1, FIGS. 2A to 2C, FIGS. 3A and 3B, FIG. 4, FIG. 5, FIG. 6, and FIG. 7, edge portions of the board 111 and the board 112 are rectangular, here, orthogonal; however, corners of the board 111 and the board 112 may be rounded.

Figure 8A:
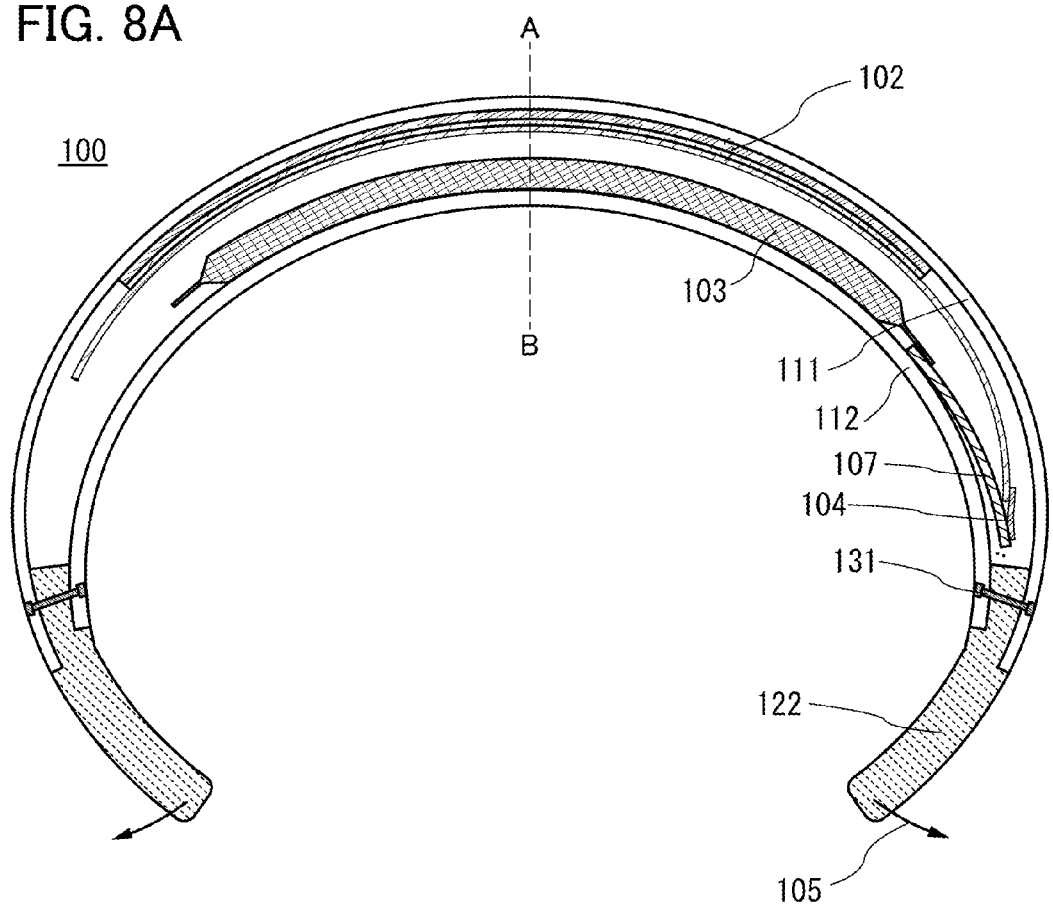
FIGS. 8A and 8B are cross-sectional views illustrating an electronic device of one embodiment of the present invention.
Figure 8B:
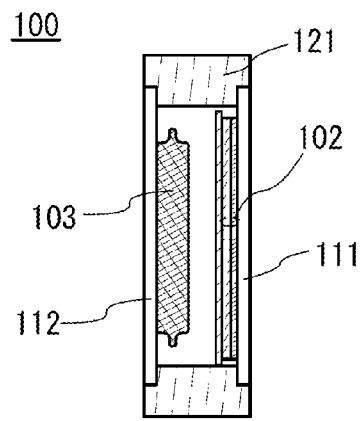

The electronic device 100 preferably includes the power storage device 103. FIGS. 8A and 8B illustrate an example in which the electronic device 100 illustrated in FIGS. 2A to 2C includes the power storage device 103. The electronic device 100 illustrated in FIGS. 8A and 8B includes the board 111, the board 112, the sealing portions 121, the sealing portions 122, the display portion 102, the circuit board 104, and the power storage device 103. FIG. 8A illustrates a cross section of the electronic device 100, and FIG. 8B illustrates a cross section taken along the dashed line A-B in FIG. 8A.

The electronic device 100 preferably includes the circuit portion 107. The power storage device 103 is preferably electrically connected to the display portion 102 through the circuit board 104, the circuit portion 107, and the like. The power storage device 103 may be directly connected to the circuit board 104.

The power storage device 103 preferably has flexibility. The power storage device 103 having flexibility will be described in detail later.

At least part of the power storage device 103 is preferably in contact with the board 112. Surfaces of the power storage device 103 and the display portion 102 in contact with each other preferably easily slide on each other. Alternatively, a space is preferably provided between the power storage device 103 and the display portion 102. The space enables the power storage device 103 and the display portion 102 to be bent independently of each other when external stress such as bending is applied to the electronic device 100. For example, when the exterior body of the power storage device 103 and a film provided with a display element in the display portion 102 are formed using different materials, the power storage device 103 and the display portion 102 sometimes have a difference in the degree of bending that is caused when external stress is applied, specifically, a change in the radius of curvature. In such a case, when the power storage device 103 and the display portion 102 do not easily slide on each other, distortion is caused in some cases in the exterior body of the power storage device 103 or the film provided with the display element in the display portion 102. The space between the power storage device 103 and the display portion 102 prevents the distortion from being caused.

The power storage device 103 is preferably positioned along a region of the board 112 where the radius of curvature is large.

Figure 9A:
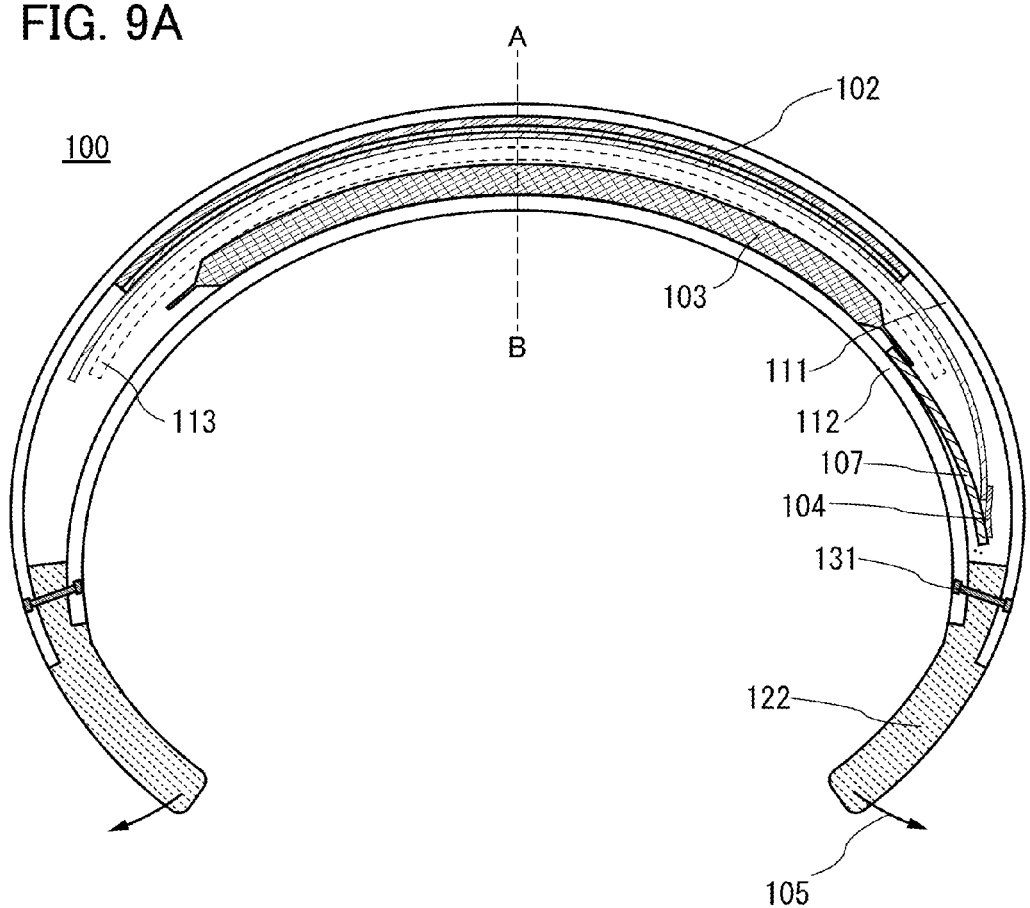
FIGS. 9A and 9B are cross-sectional views illustrating an electronic device of one embodiment of the present invention.
Figure 9B:
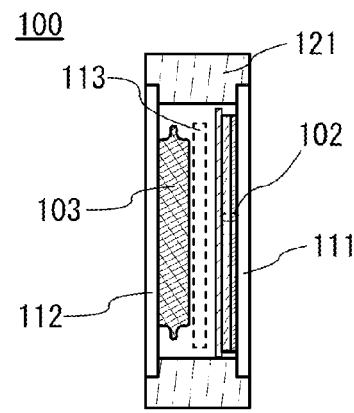

As illustrated in FIGS. 9A and 9B, the electronic device 100 may include a board 113 between the display portion 102 and the power storage device 103. FIGS. 9A and 9B are different from FIGS. 8A and 8B in that the board 113 is provided. For the board 113, any of the materials for the board 112 can be used. As the board 113, for example, a flexible board, an attachment film including a resin, a base film, or the like is preferably used.

Here, the power storage device 103 and the display portion 102 preferably partly overlap with each other. When they partly or entirely overlap with each other, the inside of the housing can have high layout flexibility in some cases.

Figure 14A:
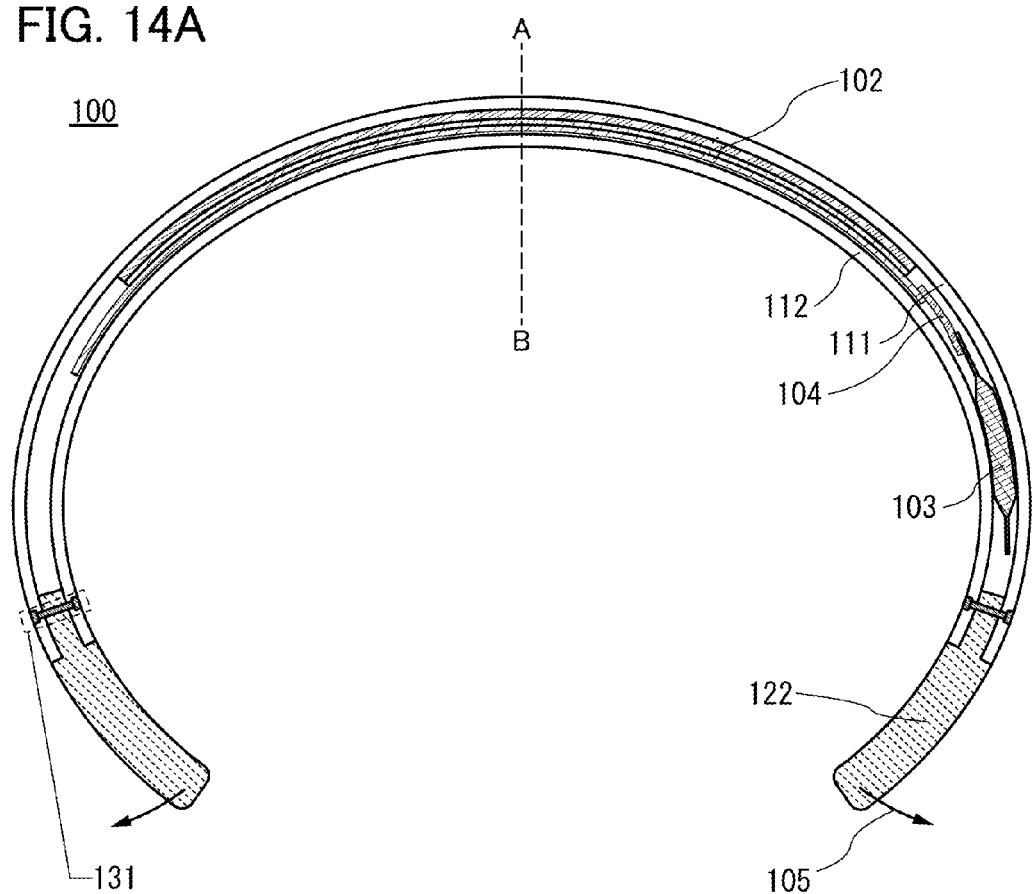
FIGS. 14A to 14C are cross-sectional views illustrating an electronic device of one embodiment of the present invention.
Figure 14B:
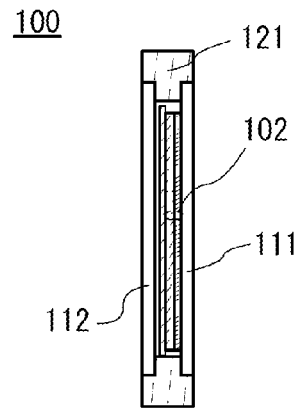
Figure 14C:
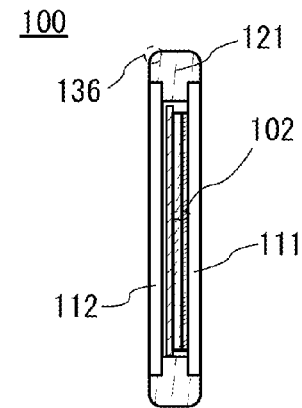

The display portion 102 and the power storage device 103 are provided so as to be stacked in FIGS. 8A and 8B, FIGS. 9A and 9B, FIGS. 10A and 10B, and FIGS. 13A to 13C; however, as illustrated in FIGS. 14A to 14C, the display portion 102 and the power storage device 103 may be arranged adjacent to each other. FIGS. 14A to 14C are different from FIGS. 8A and 8B in that the power storage device 103 is adjacent to the display portion 102 and is close to an end portion of the housing including the board 111, the board 112, the sealing portions 121, and the sealing portions 122 in the cross section of FIG. 14A. When the power storage device 103 and the display portion 102 are arranged adjacent to each other, the electronic device 100 can be thin, for example. The thin electronic device 100 can fit a body or the like more snugly in some cases.

Figure 15A:
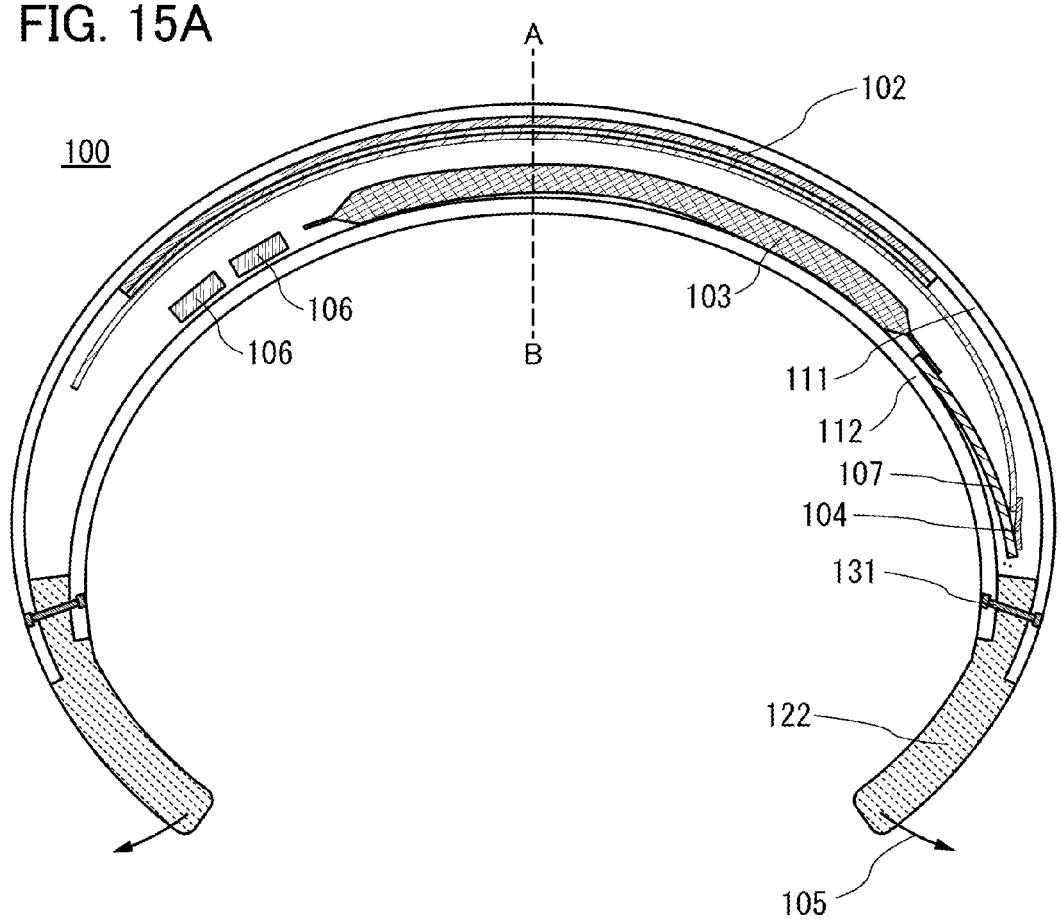
FIGS. 15A to 15C are cross-sectional views illustrating an electronic device of one embodiment of the present invention.
Figure 15B:
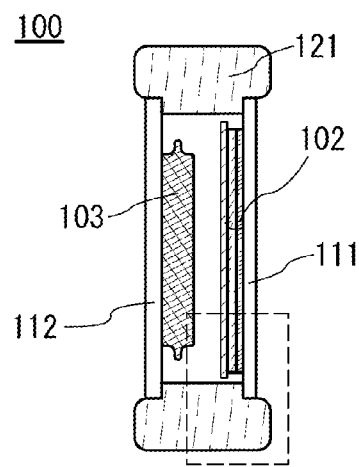
Figure 15C:
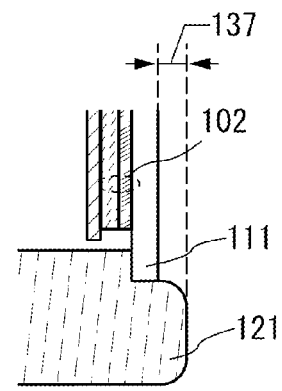

As illustrated in FIGS. 15A to 15C, the electronic device 100 may include the power storage device 103 and power storage devices 106. Here, the power storage device 103 preferably has flexibility. As the power storage device 103, for example, a thin storage battery whose exterior body is formed using a laminate film can be used. The power storage devices 106 do not necessarily have flexibility. The power storage devices 106 may have different shapes from the power storage device 103. As the power storage devices 106, for example, a coin-type (or button-type) storage battery, a rectangular storage battery, or a cylindrical storage battery can be used. For example, in the case where the electronic device 100 includes a memory or the like, the power storage devices 106 can be used as storage batteries for holding data. Furthermore, the power storage devices 106 can be used as extra storage batteries for the power storage device 103. For a coin-type storage battery, Embodiment 3 can be referred to.

For example, in the cross section of the board 112, the radius of curvature of the electronic device 100 illustrated in FIG. 1, FIGS. 2A to 2C, FIGS. 3A and 3B, FIG. 4, FIG. 5, FIG. 6, FIG. 7, FIGS. 8A and 8B, FIGS. 9A and 9B, FIGS. 10A and 10B, FIGS. 11A to 11D, FIG. 12, FIGS. 13A to 13C, FIGS. 14A to 14C, and FIGS. 15A to 15C may be 10 mm or larger, preferably 5 mm or larger. In order that the electronic device 100 illustrated in FIG. 1, FIGS. 2A to 2C, FIGS. 3A and 3B, FIG. 4, FIG. 5, FIG. 6, FIG. 7, FIGS. 8A and 8B, FIGS. 9A and 9B, FIGS. 10A and 10B, FIGS. 11A to 11D, FIG. 12, FIGS. 13A to 13C, FIGS. 14A to 14C, and FIGS. 15A to 15C can be worn on an arm snugly, the radius of curvature of the electronic device 100 is preferably 20 mm or larger, more preferably 15 mm or larger in the cross section of the board 112. The electronic device 100 preferably has a shape with which more than half of an arm in cross section can be covered.

Figure 17A:
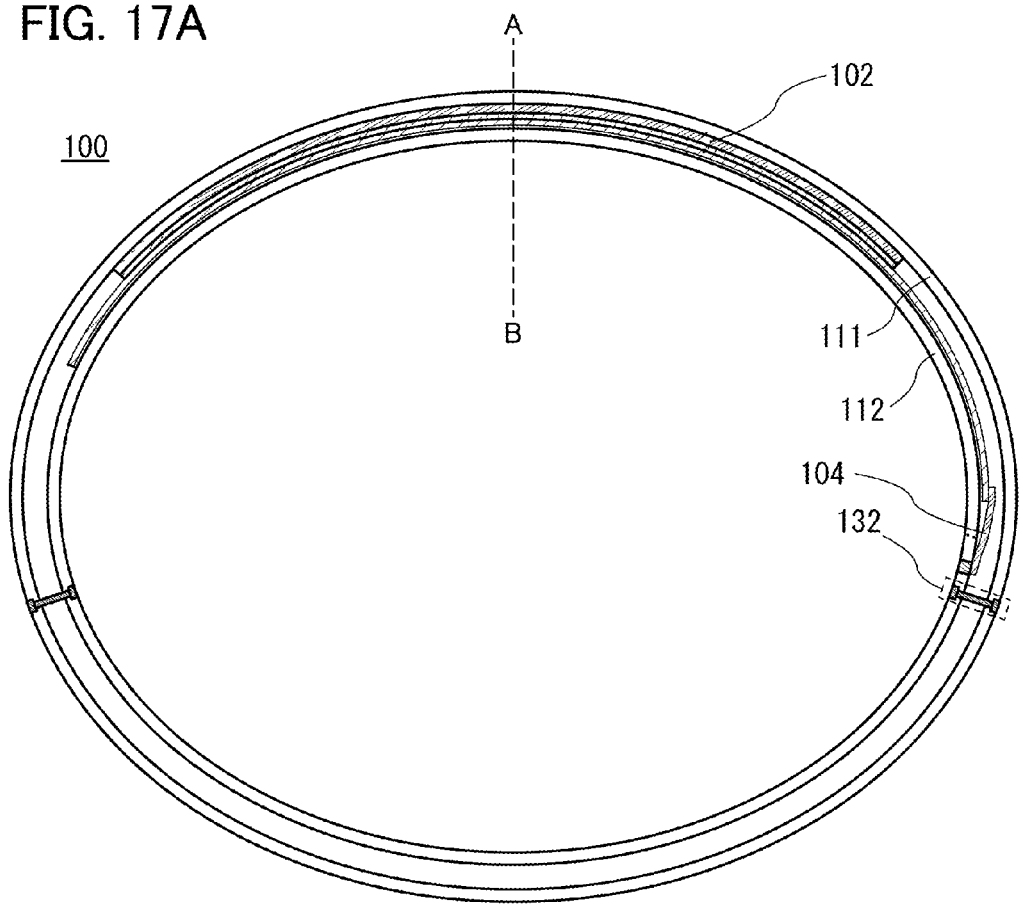
FIGS. 17A and 17B are cross-sectional views illustrating an electronic device of one embodiment of the present invention.
Figure 17B:
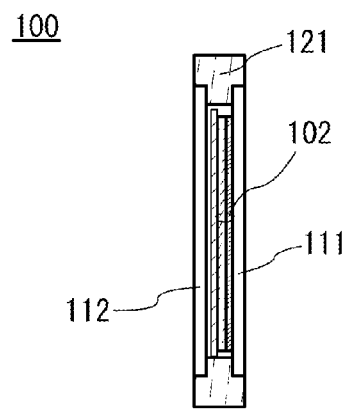

Alternatively, as in the example of FIGS. 17A and 17B, the cross section of the electronic device 100 may be ellipsoidal. FIG. 17A is a cross-sectional view of the electronic device 100. FIG. 17B illustrates a cross section taken along the dashed line A-B in FIG. 17A. The electronic device 100 illustrated in FIGS. 17A and 17B includes the board 111, the board 112, the display portion 102, the sealing portions 121, and the circuit board 104. The electronic device 100 may further include hinges 132. In the example of FIG. 17A, the cross sections of the board 111 and the board 112 are ellipsoidal.

Figure 16A:
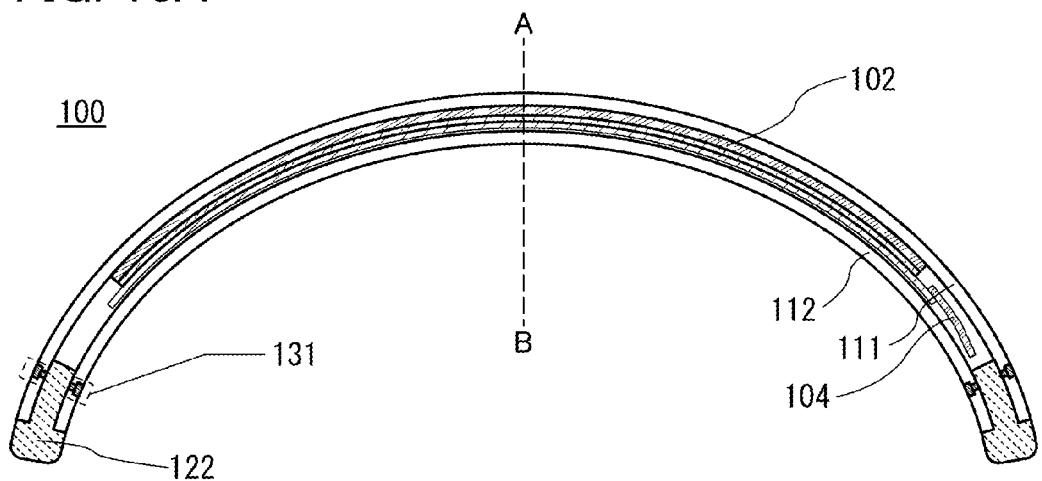
FIGS. 16A and 16B are cross-sectional views illustrating an electronic device of one embodiment of the present invention.
Figure 16B:
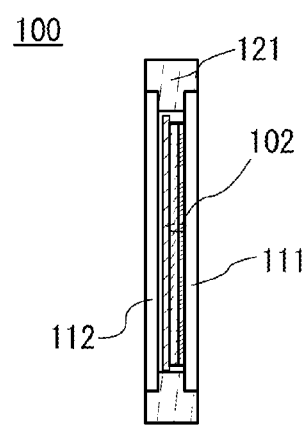

The electronic device 100 does not necessarily have a shape with which an arm is covered. For example, the electronic device 100 illustrated in FIGS. 16A and 16B can be used by being put on an arm. The electronic device 100 illustrated in FIGS. 16A and 16B can be used in such a manner that the electronic device 100 is put on an arm and part of the electronic device 100 is fixed with the use of another wearable device or wearable accessory such as a wrist watch.

The electronic device 100 may be worn on part other than an arm, such as a leg or a finger. Furthermore, the electronic device 100 may be fixed to an arm, a leg, or the like with the use of a belt, for example.

Figure 10A:
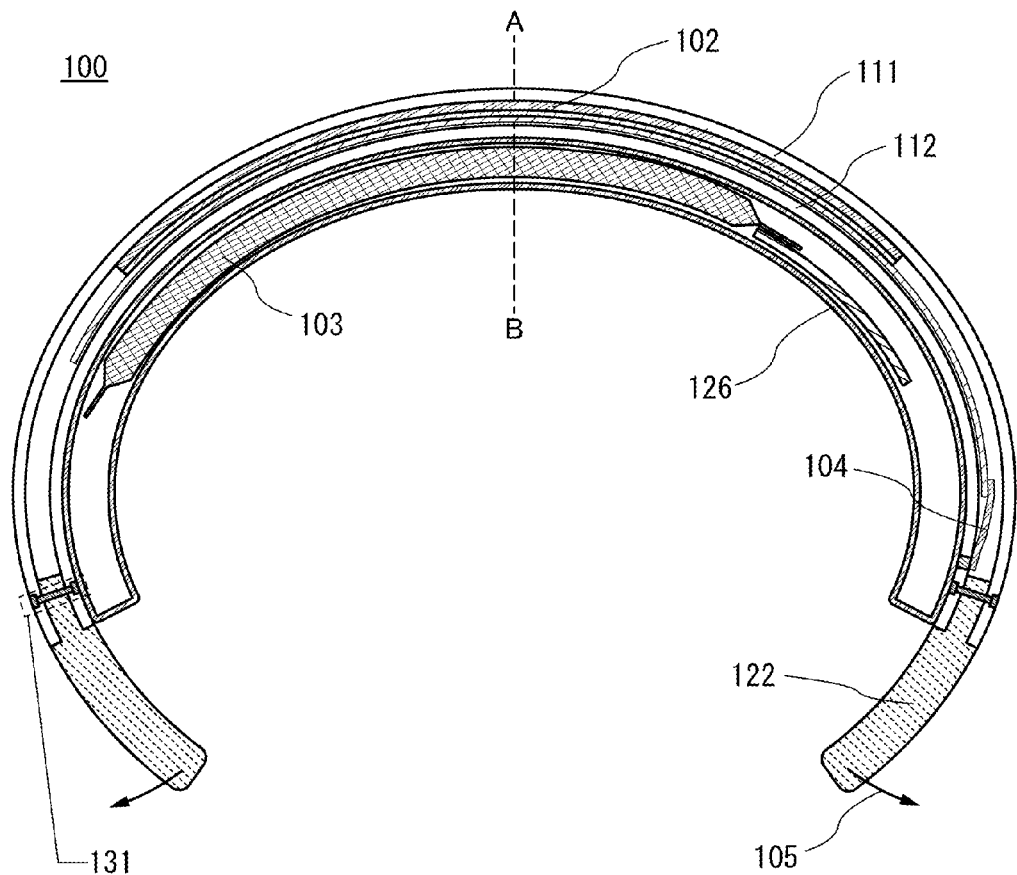
FIGS. 10A and 10B are cross-sectional views illustrating an electronic device of one embodiment of the present invention.
Figure 10B:
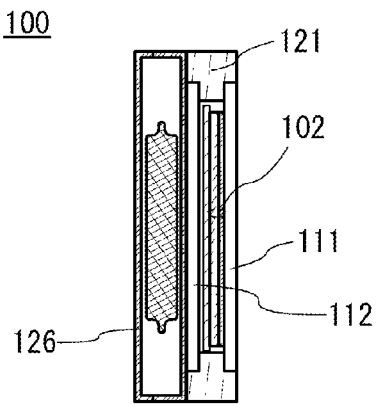

The electronic device 100 illustrated in FIGS. 10A and 10B is an example in which the electronic device 100 illustrated in FIGS. 2A to 2C includes a housing 126. The electronic device 100 illustrated in FIGS. 10A and 10B includes the board 111, the board 112, the sealing portions 121, the sealing portions 122, the display portion 102, the circuit board 104, and the housing 126. In the housing 126, the power storage device 103 is preferably provided. FIG. 10A illustrates a cross section of the electronic device 100, and FIG. 10B illustrates a cross section taken along the dashed line A-B in FIG. 1 OA.

The electronic device 100 illustrated in FIGS. 10A and 10B has a housing including the board 111, the board 112, and the sealing portions 121 and 122 in contact with the boards 111 and 112, and the housing 126.

The housing 126 preferably has flexibility. For the housing 126, any of the materials for the board 112 can be used. The housing 126 can be formed using the same material as the sealing portions 121 and the sealing portions 122, for example.

The housing 126 preferably has a first region which is fixed to the housing and a second region which is not fixed to the housing.

An example of a method for manufacturing the electronic device 100 is described below.

First, the board 111, the board 112, the sealing portions 121, and the sealing portions 122 are prepared.

Next, the power storage device 103 to be attached to the region with a large radius of curvature of the board 112 is prepared.

The power storage device 103 preferably has a bent shape. When the power storage device 103 has a bent shape, the power storage device 103 can be provided in the region with a large radius or curvature of the board 112. The power storage device 103 preferably has flexibility. The power storage device having flexibility includes a thin flexible film as an exterior body and can change its shape along a curved surface portion of the region with a large radius of curvature of the board 112. When the electronic device 100 is worn on an arm, the power storage device 103 can change its shape according to a change in the shape of the board 112, for example. As the power storage device 103, a lithium-ion secondary battery is preferably used.

Figure 19:
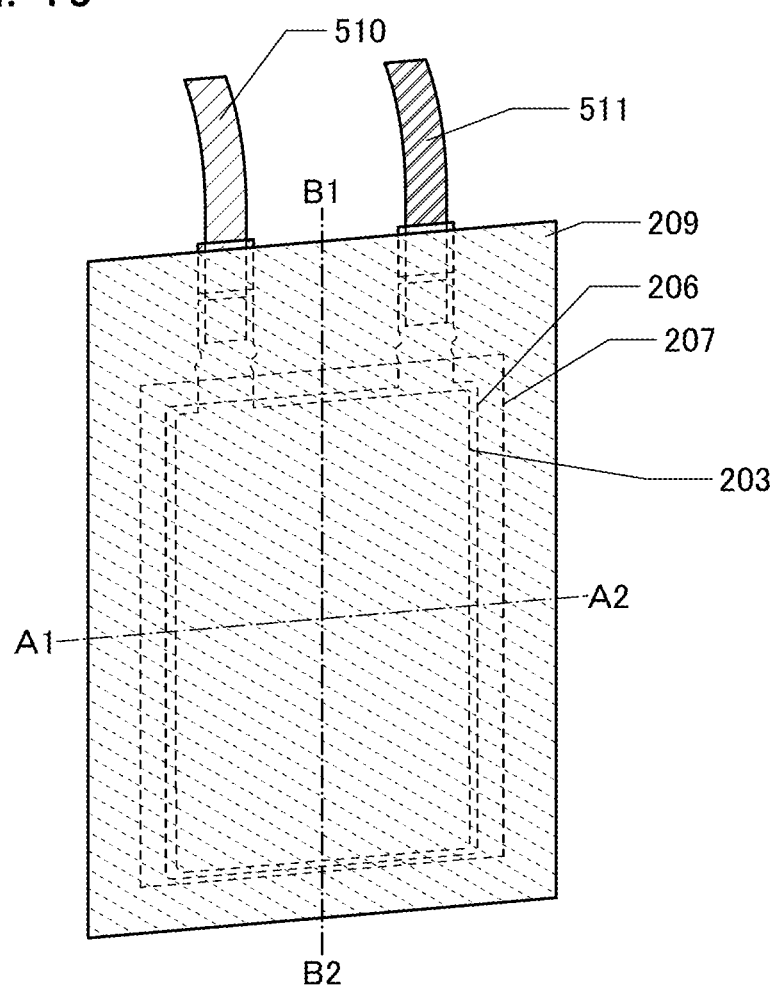
FIG. 19 is an external view of a thin storage battery.
Figure 20A:
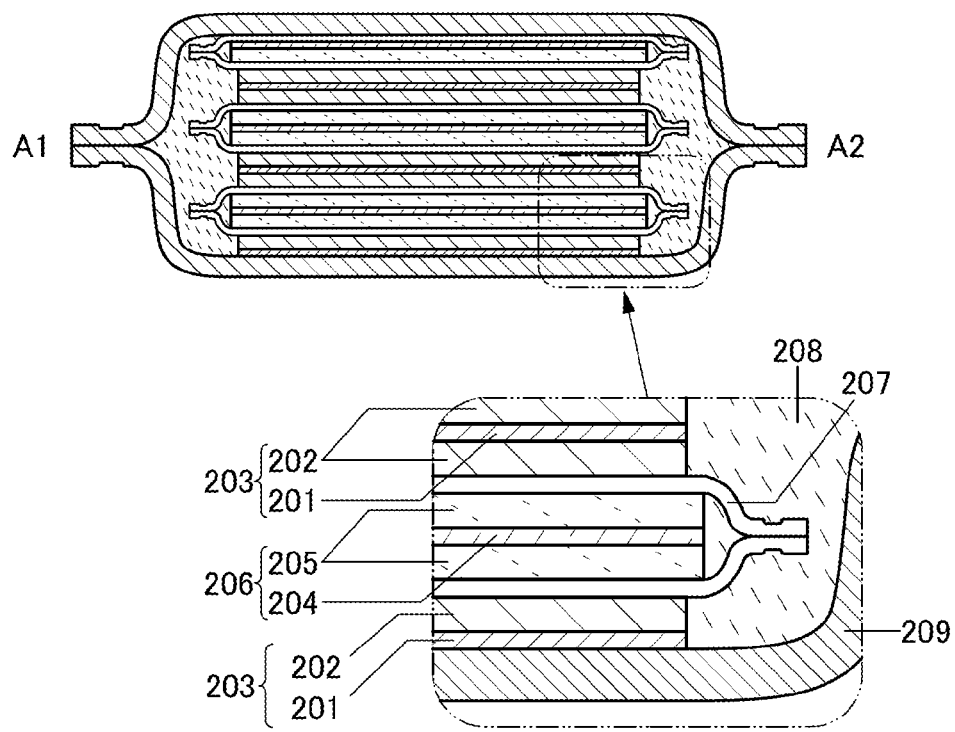
FIGS. 20A and 20B illustrate cross sections of a thin storage battery.
Figure 20B:
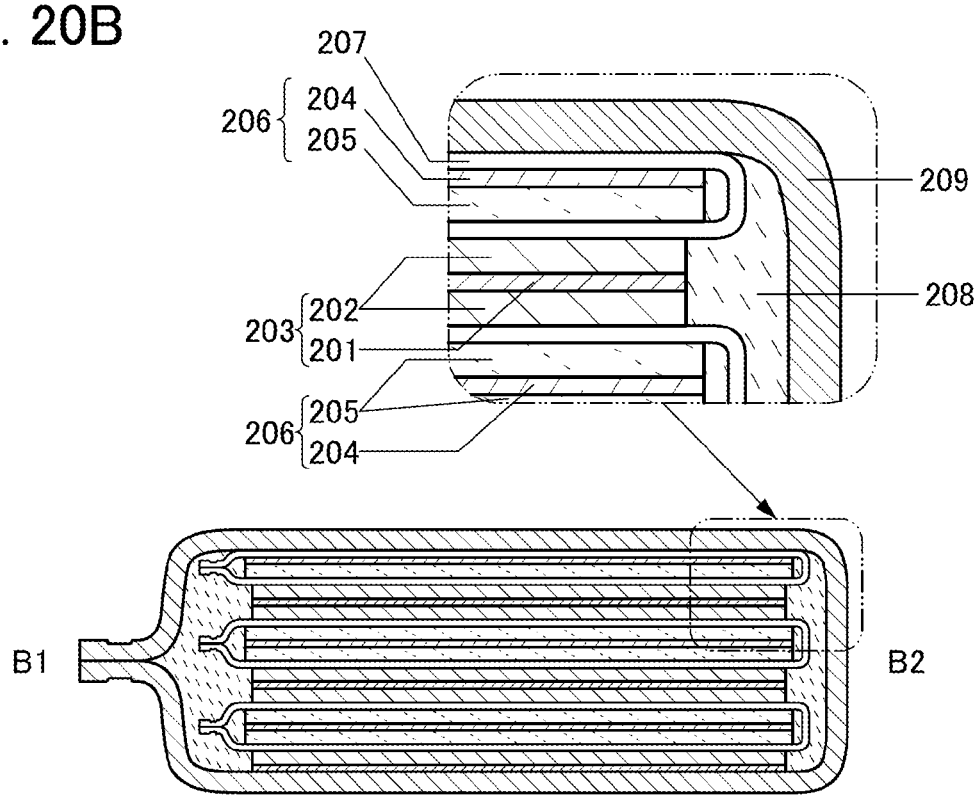

In this embodiment, an example of using, as the power storage device 103 having flexibility, a thin secondary battery whose exterior body includes a film is described. FIG. 19 is an external view of the thin secondary battery. FIG. 20A illustrates a cross section taken along the dashed-dotted line A1-A2 in FIG. 19, and FIG. 20B illustrates a cross section taken along the dashed-dotted line B1-B2 in FIG. 19.

The thin secondary battery includes a sheet-like positive electrode 203, a sheet-like negative electrode 206, a separator 207, an electrolytic solution 208, an exterior body 209 made of a film, a positive electrode lead electrode 510, and a negative electrode lead electrode 511. The separator 207 is provided between the positive electrode 203 and the negative electrode 206 in the exterior body 209. The exterior body 209 is filled with the electrolytic solution 208. Note that the positive electrode 203 includes a positive electrode current collector 201 and a positive electrode active material layer 202. The negative electrode 206 includes a negative electrode current collector 204 and a negative electrode active material layer 205.

The positive electrode current collector 201 and the negative electrode current collector 204 can each be formed using a highly conductive material which is not alloyed with a carrier ion of lithium or the like, such as a metal typified by stainless steel, gold, platinum, zinc, iron, nickel, copper, aluminum, titanium, or tantalum or an alloy thereof. Alternatively, an aluminum alloy to which an element which improves heat resistance, such as silicon, titanium, neodymium, scandium, or molybdenum, is added can be used. Still alternatively, a metal element which forms silicide by reacting with silicon can be used. Examples of the metal element which forms silicide by reacting with silicon include zirconium, titanium, hafnium, vanadium, niobium, tantalum, chromium, molybdenum, tungsten, cobalt, nickel, and the like. The positive electrode current collector 201 and the negative electrode current collector 204 can each have a foil-like shape, a plate-like shape (sheet-like shape), a net-like shape, a cylindrical shape, a coil shape, a punching-metal shape, an expanded-metal shape, or the like as appropriate. The positive electrode current collector 201 and the negative electrode current collector 204 each preferably have a thickness greater than or equal to 10 μm and less than or equal to 30 μm.

For the positive electrode active material layer 202, a material into and from which lithium ions can be inserted and extracted can be used. For example, a lithium-containing material with an olivine crystal structure, a layered rock-salt crystal structure, and a spinel crystal structure can be used. As the positive electrode active material, a compound such as $LiFeO_2$, $LiCoO_2$, $LiNiO_2$, $LiMn_2O_4$, $V_2O_5$, $Cr_2O_5$, or $MnO_2$ can be used.

Alternatively, a lithium-containing complex phosphate ($LiMPO_4$ (general formula) (M is at least one of Fe(II), Mn(II), Co(II), and Ni(II))) can be used. Typical examples of the general formula $LiMPO_4$ include $LiFePO_4$, $LiNiPO_4$, $LiCoPO_4$, $LiMnPO_4$, $LiFe_aNi_bPO_4$, $LiFe_aCo_bPO_4$, $LiFe_aMn_bPO_4$, $LiNi_aCo_bPO_4$, $LiNi_aMn_bPO_4$ (a+b≤1, 0<a<1, and 0<b<1), $LiFe_cNi_dCo_ePO_4$, $LiFe_cNi_dMn_ePO_4$, $LiNi_cCo_dMn_ePO_4$ (c+d+e≤1, 0<c<1, 0<d<1, and 0<e<1), and $LiFe_fNi_gCo_hMn_iPO_4$ (f+g+h+i≤1, 0<f<1, 0<g<1, 0<h<1, and 0<i<1).

$LiFePO_4$ is particularly preferable because it properly has properties necessary for the positive electrode active material, such as safety, stability, high capacity density, high potential, and the existence of lithium ions which can be extracted in initial oxidation (charging).

Examples of the lithium-containing material with a layered rock-salt crystal structure include a lithium-containing material such as lithium cobalt oxide ($LiCoO_2$), $LiNiO_2$, $LiMnO_2$, or $Li_2MnO_3$; an NiCo-based lithium-containing material (a general formula thereof is $LiNi_xCo_{1-x}O_2$ (0<x<1)) such as $LiNi_{0.8}Co_{0.2}O_2$; an NiMn-based lithium-containing material (a general formula thereof is $LiNi_xM_{1-x}O_2$ (0<x<1)) such as $LiNi_{0.5}Mn_{0.5}O_2$; and an NiMnCo-based lithium-containing material (also referred to as NMC, and a general formula thereof is $LiNi_xMn_yCo_{1-x-y}O_2$ (x>0, y>0, x+y<1)) such as $LiNi_{1/3}Mn_{1/3}Co_{1/3}O_2$. Moreover, the examples further include $Li(Ni_{0.8}Co_{0.15}Al_{0.05})O_2$ and $Li_2MnO_3$—$LiMO_2$ (M=Co, Ni, or Mn).

Examples of the lithium-containing material with a spinel crystal structure include $LiMn_2O_4$, $Li_{1+x}Mn_{2-x}O_4$, $LiMn_{2-x}Al_xO_4$ (0<x<2), and $LiMn_{1.5}Ni_{0.5}O_4$.

It is preferable to add a small amount of lithium nickel oxide ($LiNiO_2$ or $LiNi_{1-x}O_2$ (M=Co or Al, for example)) to a lithium-containing material with a spinel crystal structure which contains manganese such as $LiMn_2O_4$ because advantages such as inhibition of the dissolution of manganese and the decomposition of an electrolytic solution can be obtained.

Alternatively, a lithium-containing material represented by a general formula, $Li_{(2-j)}MSiO_4$ (M is one or more of Fe(II), Mn(II), Co(II), and Ni(II), 0≤j≤2), can be used as the positive electrode active material. Typical examples of $Li_{(2-j)}MSiO_4$ (general formula) include lithium compounds such as $Li_{(2-j)}FeSiO_4$, $Li_{(2-j)}NiSiO_4$, $Li_{(2-j)}CoSiO_4$, $Li_{(2-j)}MnSiO_4$, $Li_{(2-j)}Fe_kNi_lSiO_4$, $Li_{(2-j)}Fe_kCo_lSiO_4$, $Li_{(2-j)}Fe_kMn_lSiO_4$, $Li_{(2-j)}Ni_kCo_lSiO_4$, $Li_{(2-j)}Ni_kMn_lSiO_4$ (k+l≤1, 0<k<1, and 0<l<1), $Li_{(2-j)}Fe_mNi_nCo_qSiO_4$, $Li_{(2-j)}Fe_mNi_nMn_qSiO_4$, $Li_{(2-j)}Ni_mCo_nMn_qSiO_4$ (m+n+q≤1, 0<m<1, 0<n<1, and 0<q<1), and $Li_{(2-j)}Fe_rNi_sCo_tMn_uSiO_4$ (r+s+t+u≤1, 0<r<1, 0<s<1, 0<t<1, and 0<u<1).

Still alternatively, a NASICON compound represented by a general formula, $A_xM_2(XO_4)_3$ (A=Li, Na, or Mg, M=Fe, Mn, Ti, V, Nb, or Al, and X=S, P, Mo, W, As, or Si), can be used as the positive electrode active material. Examples of the NASICON compound include $Fe_2(MnO_4)_3$, $Fe_2(SO_4)_3$, and $Li_3Fe_2(PO_4)_3$. Still further alternatively, a compound represented by a general formula, $Li_2MPO_4F$, $Li_2MP_2O_7$, or $Li_5MO_4$ (M=Fe or Mn), a perovskite fluoride such as $NaF_3$ or $FeF_3$, a metal chalcogenide (a sulfide, a selenide, or a telluride) such as $TiS_2$ or $MoS_2$, a material with an inverse spinel crystal structure such as $LiMVO_4$, a vanadium oxide (e.g., $V_2O_5$, $V_6O_{13}$, or $LiV_3O_8$), a manganese oxide, or an organic sulfur compound can be used as the positive electrode active material, for example.

The positive electrode active material layer 202 may further include a binder for increasing adhesion of active materials, a conductive additive for increasing the conductivity of the positive electrode active material layer 202, and the like in addition to the above-described positive electrode active materials.

A material with which lithium can be dissolved and precipitated or a material into and from which lithium ions can be inserted and extracted can be used for the negative electrode active material layer 205; for example, a lithium metal, a carbon-based material, or an alloy-based material can be used.

The lithium metal is preferable because of its low redox potential (3.045 V lower than that of a standard hydrogen electrode) and high specific capacity per unit weight and per unit volume (3860 mAh/g and 2062 mAh/cm$^3$).

Examples of the carbon-based material include graphite, graphitizing carbon (soft carbon), non-graphitizing carbon (hard carbon), a carbon nanotube, graphene, carbon black, and the like.

Examples of the graphite include artificial graphite such as meso-carbon microbeads (MCMB), coke-based artificial graphite, or pitch-based artificial graphite and natural graphite such as spherical natural graphite.

Graphite has a low potential substantially equal to that of a lithium metal (lower than or equal to 0.3 V vs. Li/Li$^+$) when lithium ions are intercalated into the graphite (while a lithium-graphite intercalation compound is formed). For this reason, a lithium-ion secondary battery can have a high operating voltage. In addition, graphite is preferable because of its advantages such as relatively high capacity per unit volume, small volume expansion, low cost, and safety greater than that of a lithium metal.

For the negative electrode active material, an alloy-based material which enables charge-discharge reactions by an alloying reaction and a dealloying reaction with lithium can be used. For example, in the case where carrier ions are lithium ions, a material including at least one of Mg, Ca, Al, Si, Ge, Sn, Pb, Sb, As, Bi, Ag, Au, Zn, Cd, Hg, In, and the like can be used. Such elements have higher capacity than carbon. In particular, silicon has a significantly high theoretical capacity of 4200 mAh/g. For this reason, silicon is preferably used for the negative electrode active material. Examples of the alloy-based material using such elements include $Mg_2Si$, $Mg_2Ge$, $Mg_2Sn$, $SnS_2$, $V_2Sn_3$, $FeSn_2$, $CoSn_2$, $Ni_3Sn_2$, $Cu_6Sn_5$, $Ag_3Sn$, $Ag_3Sb$, $Ni_2MnSb$, $CeSb_3$, $LaSn_3$, $La_3Co_2Sn_7$, $CoSb_3$, InSb, SbSn, and the like.

Alternatively, for the negative electrode active material, an oxide such as SiO, SnO, $SnO_2$, titanium dioxide ($TiO_2$), lithium titanium oxide ($Li_4Ti_5O_{12}$), lithium-graphite intercalation compound ($Li_xC_6$), niobium pentoxide ($Nb_2O_5$), tungsten oxide ($WO_2$), or molybdenum oxide ($MoO_2$) can be used.

Still alternatively, for the negative electrode active material, $Li_{3-x}M_xN$ (M=Co, Ni, or Cu) with a $Li_3N$ structure, which is a nitride containing lithium and a transition metal, can be used. For example, $Li_{2.6}Co_{0.4}N_3$ is preferable because of high charge and discharge capacity (900 mAh/g and 1890 mAh/cm$^3$).

A nitride containing lithium and a transition metal is preferably used, in which case lithium ions are contained in the negative electrode active material and thus the negative electrode active material can be used in combination with a material for a positive electrode active material which does not contain lithium ions, such as $V_2O_5$ or $Cr_3O_8$. In the case of using a material containing lithium ions as a positive electrode active material, the nitride containing lithium and a transition metal can be used for the negative electrode active material by extracting the lithium ions contained in the positive electrode active material in advance.

Alternatively, a material which causes a conversion reaction can be used for the negative electrode active material; for example, a transition metal oxide which does not cause an alloy reaction with lithium, such as cobalt oxide (CoO), nickel oxide (NiO), or iron oxide (FeO), may be used. Other examples of the material which causes a conversion reaction include oxides such as $Fe_2O_3$, CuO, $Cu_2O$, $RuO_2$, and $Cr_2O_3$, sulfides such as $CoS_{0.89}$, NiS, and CuS, nitrides such as $Zn_3N_2$, $Cu_3N$, and $Ge_3N_4$, phosphides such as $NiP_2$, $FeP_2$, and $CoP_3$, and fluorides such as $FeF_3$ and $BiF_3$. Note that any of the fluorides can be used as a positive electrode active material because of its high potential.

The negative electrode active material layer 205 may further include a binder for increasing adhesion of active materials, a conductive additive for increasing the conductivity of the negative electrode active material layer 205, and the like in addition to the above-described negative electrode active materials.

As an electrolyte in the electrolytic solution 208, a material which has carrier ion mobility and contains lithium ions serving as carrier ions is used. Typical examples of the electrolyte are lithium salts such as $LiPF_6$, $LiClO_4$, $Li(FSO_2)_2$ N, $LiAsF_6$, $LiBF_4$, $LiCF_3SO_3$, $Li(CF_3SO_2)_2N$, and $Li(C_2F_5SO_2)_2N$. One of these electrolytes may be used alone, or two or more of them may be used in an appropriate combination and in an appropriate ratio. In order to stabilize a reaction product, a small amount (1 wt %) of vinylene carbonate (VC) may be added to the electrolytic solution so that the decomposition amount of the electrolytic solution is further reduced.

As a solvent of the electrolytic solution 208, a material in which carrier ions can transfer is used. As the solvent of the electrolytic solution, an aprotic organic solvent is preferably used. Typical examples of aprotic organic solvents include ethylene carbonate (EC), propylene carbonate, dimethyl carbonate, diethyl carbonate (DEC), γ-butyrolactone, acetonitrile, dimethoxyethane, tetrahydrofuran, and the like, and one or more of these materials can be used. When a gelled high-molecular material is used as the solvent of the electrolytic solution, safety against liquid leakage and the like is improved. Furthermore, the storage battery can be thinner and more lightweight. Typical examples of gelled high-molecular materials include a silicone gel, an acrylic gel, an acrylonitrile gel, a polyethylene oxide-based gel, a polypropylene oxide-based gel, a gel of a fluorine-based polymer, and the like. Alternatively, the use of one or more of ionic liquids (room temperature molten salts) which have features of non-flammability and non-volatility as a solvent of the electrolytic solution can prevent the storage battery from exploding or catching fire even when the storage battery internally shorts out or the internal temperature increases owing to overcharging or the like.

As the separator 207, an insulator such as cellulose (paper), polypropylene, or polyethylene can be used. Here, pores are provided in polyethylene or polypropylene, for example.

In the secondary battery, a thin flexible film (such as a laminate film) is used as an exterior body. The laminate film refers to a stacked film of a base film and an adhesive synthetic resin film, or a stacked film of two or more kinds of films. For the base film, polyester such as PET or PBT, polyamide such as nylon 6 or nylon 66, an inorganic film formed by evaporation, or paper may be used. For the adhesive synthetic resin film, polyolefin such as PE or PP, an acrylic-based synthetic resin, an epoxy-based synthetic resin, or the like may be used. An object is laminated with the laminate film by thermocompression bonding using a laminating apparatus. Note that an anchor coat agent is preferably applied as pretreatment for the laminating step so that the adhesion between the laminate film and the object can be increased. As the anchor coat agent, an isocyanate-based material or the like may be used.

For a method for manufacturing the thin secondary battery whose exterior body includes a film, Embodiment 3 can be referred to.

The thin secondary battery obtained as described above is first attached to the region with a large radius of curvature of the board 112 and then to the other regions. By first attaching the secondary battery to the region with a large radius of curvature, damage to the secondary battery can be reduced during attachment to the board 112.

Next, a display module to be attached to the power storage device 103 is prepared.

The display portion 102 is flexible. The display portion 102 includes a display element over a flexible film.

Examples of methods for manufacturing the display element over the flexible film include a method in which the display element is directly formed over the flexible film, a method in which a layer including the display element is formed over a rigid substrate such as a glass substrate, the substrate is removed by etching, polishing, or the like, and then the layer including the display element and the flexible film are attached to each other, a method in which a separation layer is provided over a rigid substrate such as a glass substrate, a layer including the display element is formed thereover, the rigid substrate and the layer including the display element are separated from each other using the separation layer, and then the layer including the display element and the flexible film are attached to each other, and the like.

In this embodiment, a manufacturing method which allows heat treatment to be performed at 400° C. or higher and which can improve the reliability of the display element, i.e., a technique in which a separation layer is provided over a rigid substrate such as a glass substrate as disclosed in Japanese Published Patent Application No. 2003-174153, is used so that the display portion 102 can be an active-matrix display device capable of displaying high-resolution images.

The technique disclosed in Japanese Published Patent Application No. 2003-174153 enables transistors including polysilicon in active layers or transistors including oxide semiconductor layers to be provided over a flexible substrate or film. These transistors are used as switching elements, and electroluminescent (EL) elements are provided.

In a common structure of the EL element, a layer including a light-emitting organic compound or inorganic compound (hereinafter referred to as a light-emitting layer) is provided between a pair of electrodes, and when a voltage is applied to the element, electrons and holes are separately injected and transported from the pair of electrodes to the light-emitting layer. When those carriers (electrons and holes) recombine, an excited state of the light-emitting organic compound or inorganic compound is formed, and when the light-emitting organic compound or inorganic compound returns to a ground state, light is emitted.

Further, kinds of excited state that can be formed by an organic compound are a singlet excited state and a triplet excited state. Light emission in the case of a singlet excited state is referred to as fluorescence, and light emission in the case of a triplet excited state is referred to as phosphorescence.

Such a light-emitting element is usually formed of thin films which have a thickness of submicrons to several microns. Therefore, they can be manufactured to be thin and light, which is a large advantage. Further, such light-emitting elements also have an advantage in that the period of time from when the carriers are injected until light is emitted is microseconds at the most, so they have a very high response speed. Moreover, because sufficient light emission can be obtained with a direct current voltage of several to several tens of volts, power consumption is also relatively low.

EL elements have a wider viewing angle than liquid crystal elements and are preferable as display elements in the display portion 102 when a display region has a curved surface. In addition, EL elements are preferable as display elements in the display portion 102 in that unlike liquid crystal elements, EL elements do not require a backlight, which makes it possible to reduce power consumption, the number of components, and the total thickness.

Note that methods for manufacturing display elements over a flexible film are not limited to the method mentioned above (Japanese Published Patent Application No. 2003-174153). Methods and materials for manufacturing EL elements may be known methods and materials and are therefore not described here.

The display device used as the display portion 102 may only be capable of simply displaying single-color images or displaying numbers. Therefore, a passive-matrix display device may be used, in which case a display element may be manufactured over a flexible film using a method other than the technique disclosed in Japanese Published Patent Application No. 2003-174153.

The display module obtained by the above method is attached to the power storage device 103, and the power storage device 103 and the display portion 102 are electrically connected to each other. Then, the board 111, the board 112, the sealing portions 121, and the sealing portions 122 are positioned, whereby the housing is formed. The electronic device 100 is assembled such that the display module and the like are positioned in the housing. Thus, the electronic device 100 illustrated in FIG. 11B is completed. Furthermore, a metal cover, a plastic cover, or a rubber cover may be provided over a portion other than the display portion 102 to improve the appearance of the electronic device 100.

In the case where the electronic device 100 is provided with the display portion 102, the screen size is not particularly limited as long as the display portion 102 is of such a size that it can be disposed over the board 112. For example, in the case where the electronic device is worn on an arm, the maximum screen size is the product of an arm girth of 23 cm and a wrist-to-elbow length because the girth of an adult arm near a wrist is 18 cm±5 cm. The wrist-to-elbow length of an adult is shorter than or equal to a feet (30.48 cm); thus, the maximum screen size of the display portion that can be disposed over the board 112 in the form of a cylinder tube in the electronic device 100 that is worn on an arm is 23 cm×30.48 cm. Note that the screen size here does not refer to the size in a curved state but refers to the size in a flat state. A plurality of display portions may be provided in one electronic device; for example, a second display portion smaller than a first display portion may be included in an electronic device. The dimension of the board 112 is set larger than the screen size of the display portion. In the case of using EL elements, when the display portion is of such a screen size that it can be disposed over the support structure body, the sum of the weights of the display panel and the FPC can be more than or equal to 1 g and less than 10 g. Here, the length of each of the board 111 and the board 112 is greater than or equal to 5 cm and less than or equal to 30 cm, and the width thereof is greater than or equal to 1 cm and less than or equal to 35 cm.

The thickness of the thinnest portion of the electronic device 100 provided with the display module can be less than or equal to 5 mm. The thickness of the thickest portion of the electronic device 100, which is a portion where the display panel and the FPC are connected to each other, can be less than 1 cm.

The total weight of the electronic device 100 can be less than 100 g.

The electronic device 100 can be put on an arm because part of the support structure body can be moved in the direction of the arrows 105 as illustrated in the cross-sectional views of FIG. 2A and the like. The electronic device 100 has a total weight less than 100 g, preferably less than or equal to 50 g and a small maximum thickness less than or equal to 1 cm; thus, a lightweight electronic device can be provided.

Figure 27A:
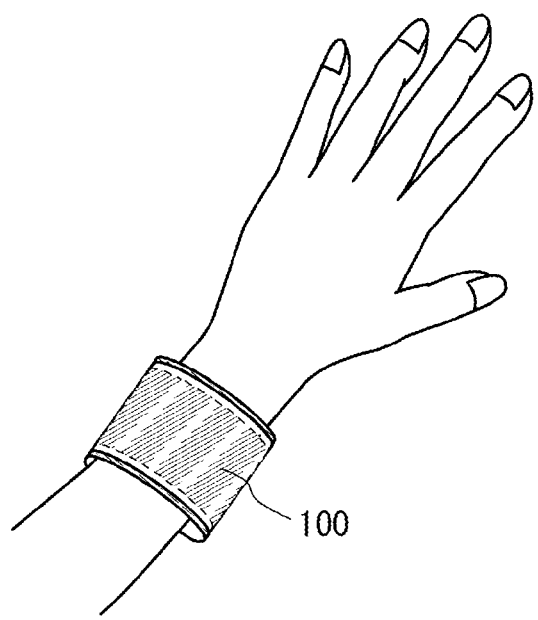
FIGS. 27A to 27C illustrate embodiments of the present invention.
Figure 27B:
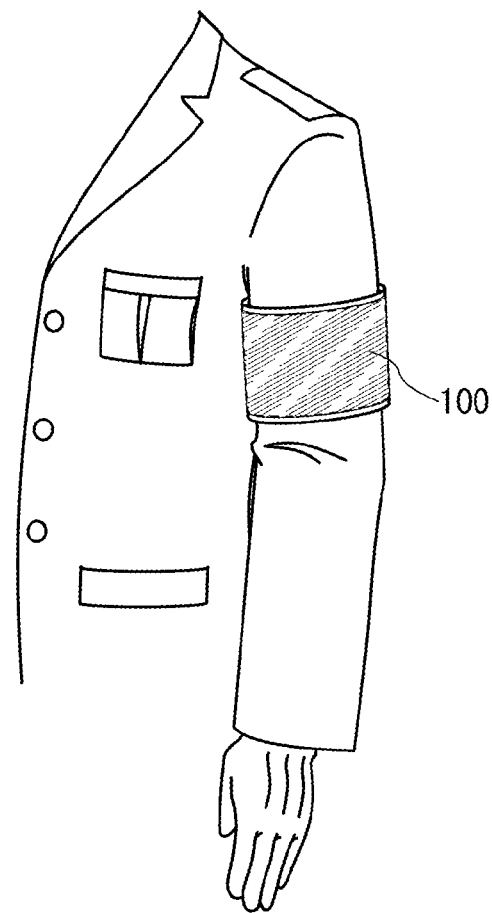
Figure 27C:
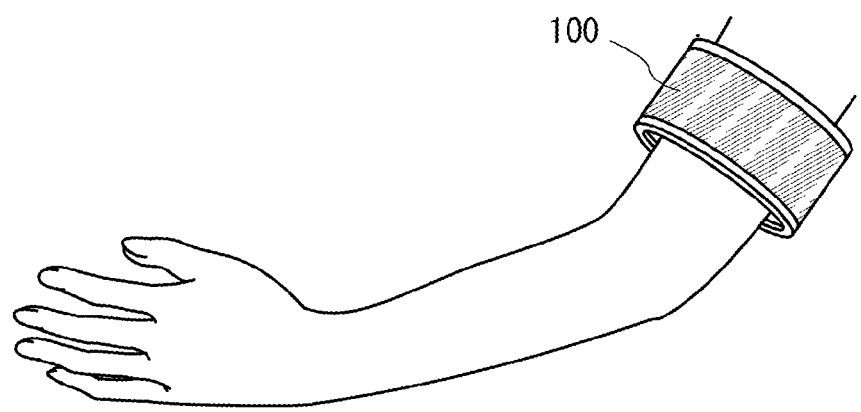

FIGS. 27A to 27C each illustrate an example of how to wear the electronic device 100. In the example of FIG. 27A, the electronic device 100 is worn on an arm (a wrist). In the example of FIG. 27C, the electronic device 100 is worn on the upper portion of an arm. In the example of FIG. 27B, the electronic device 100 is an armband device.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. In addition to that, display media whose contrast, luminance, reflectivity, transmittance, or the like is changed by electrical or magnetic effect may be included. Examples of a display device having an EL element include an EL display. Display devices having electron emitters include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples further include a display device including electronic ink, Electronic Liquid Powder (registered trademark), or an electrophoretic element, such as electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. When graphene or graphite is provided in this manner, a nitride semiconductor, for example, an n-type GaN semiconductor layer including crystals can be easily formed thereover. Furthermore, a p-type GaN semiconductor layer including crystals or the like can be provided thereover, and thus the LED can be formed. Note that an MN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

In addition to the display device, the electronic device of one embodiment of the present invention may include another semiconductor circuit, e.g., a control circuit for preventing overcharge, an imaging element, a sensor such as a gyroscope sensor or an acceleration sensor, a touch panel, or the like. Furthermore, a sensor or the like for measuring a pulse, a surface temperature, a blood oxygen level, or the like by touch on part of a human body may be included. For example, when an imaging element is included in addition to the display device, a taken image can be displayed on the display device. When a sensor such as a gyroscope sensor or an acceleration sensor is included, the arm-worn electronic device can be powered on or off depending on the orientation or movement thereof to reduce power consumption. When a touch panel is included, the electronic device can be operated or information can be input by touching a predetermined position of the touch panel. When a memory and a CPU are included in addition to the display device in the above structure, a wearable computer can be obtained.

When the electronic device of one embodiment of the present invention is used as the display portion of the arm-worn electronic device together with a display portion of a conventional portable information terminal, the electronic device of one embodiment of the present invention can be used as a sub-display.

This embodiment can be implemented in appropriate combination with any of the other embodiment.

(Embodiment 2)

In this embodiment, an example of a method for charging a power storage device by wireless power feeding will be described. For wireless power feeding, an electric field, a magnetic field, an electromagnetic wave, or the like can be used. An antenna, a coil, or the like can be used for receiving an electric field, a magnetic field, an electromagnetic wave, or the like.

An electronic device of one embodiment of the present invention preferably includes an antenna, a coil, or the like for receiving an electric field, a magnetic field, an electromagnetic wave, or the like. The electronic device of one embodiment of the present invention preferably includes a capacitor for charging.

When a coupling coil and a coupling capacitor are used, the power storage device can be charged without contact. An antenna can be used instead of a coupling coil. Here, a secondary battery is used as a power storage device, for example. By an electromagnetic induction method in which a primary coil of a charger and a secondary coil of the electronic device are magnetically coupled and a voltage is generated at the secondary coil with an alternating magnetic field generated from the primary coil, electric power is transmitted to the secondary coil side without contact. Through this mechanism, the secondary battery is charged. It is preferable that the coil be provided in contact with the curved surface of the structure body; therefore, it is preferable that the coil of the electronic device be provided over a flexible film. Here, the coil provided in the electronic device may be used as an antenna.

The secondary battery in an arm-worn electronic device including a display module may be provided with an antenna for purposes other than contactless charging of the secondary battery. A memory may be further provided, and an antenna that enables electronic data transmission and reception or an antenna that enables display of position or time with a GPS function by obtaining positional information or GPS time may be provided.

Since an electronic device is to be in contact with part of a human body, it is preferable for safety that input and output terminals for charging or discharging a secondary battery be not exposed. In the case where the input and output terminals are exposed, the input and output terminals might short-circuit by water such as rain, or the input and output terminals might be in contact with a human body and cause an electric shock. The use of an antenna enables a structure in which the input and output terminals are not exposed on a surface of the electronic device.

Note that this embodiment is the same as Embodiment 1 except that an antenna, a coil, and a converter for wireless power feeding are provided; therefore, the other components are not described in detail here.

As in Embodiment 1, a power storage device, here, a secondary battery is fixed to a board, and a display module is attached to the secondary battery. The secondary battery preferably has a bent shape. Furthermore, the secondary battery is preferably flexible. A converter for wireless power feeding and an antenna which are electrically connected to the secondary battery are provided. The converter for wireless power feeding is fixed so as to overlap with part of a display portion.

The converter for wireless power feeding and the antenna weigh less than or equal to 10 g, and the total weight does not significantly differ from that in Embodiment 1.

Figure 18:
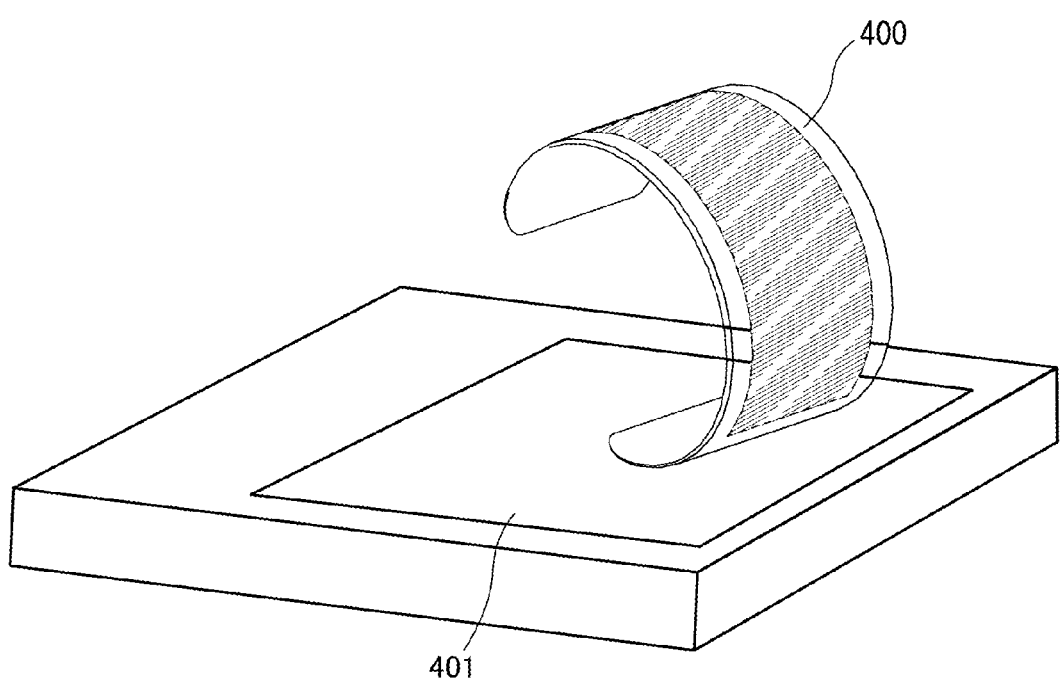
FIG. 18 is a perspective view illustrating one embodiment of the present invention.

FIG. 18 is a schematic diagram of an electronic device 400 including an antenna (not illustrated) and a charger 401. When the electronic device 400 is disposed over the charger 401, electric power can be supplied from an antenna of the charger 401 to the electronic device 400 to charge a secondary battery of the electronic device 400.

Information such as the remaining amount or time to full charge can be displayed on a display portion of the electronic device 400.

This embodiment can be implemented in appropriate combination with any of the other embodiment.

(Embodiment 3)

In this embodiment, examples of a method for manufacturing the thin storage battery described in Embodiment 1 and a structure of a coin-type storage battery will be described.

[Method for Manufacturing Thin Secondary Battery]

A method for manufacturing the thin secondary battery whose exterior body includes a film, which is described in Embodiment 1, will be described. FIG. 19 is an external view of the thin secondary battery. FIG. 20A illustrates a cross section taken along the dashed-dotted line A1-A2 in FIG. 19, and FIG. 20B illustrates a cross section taken along the dashed-dotted line B1-B2 in FIG. 19.

A method for manufacturing the thin secondary battery will be described.

Figure 21A:
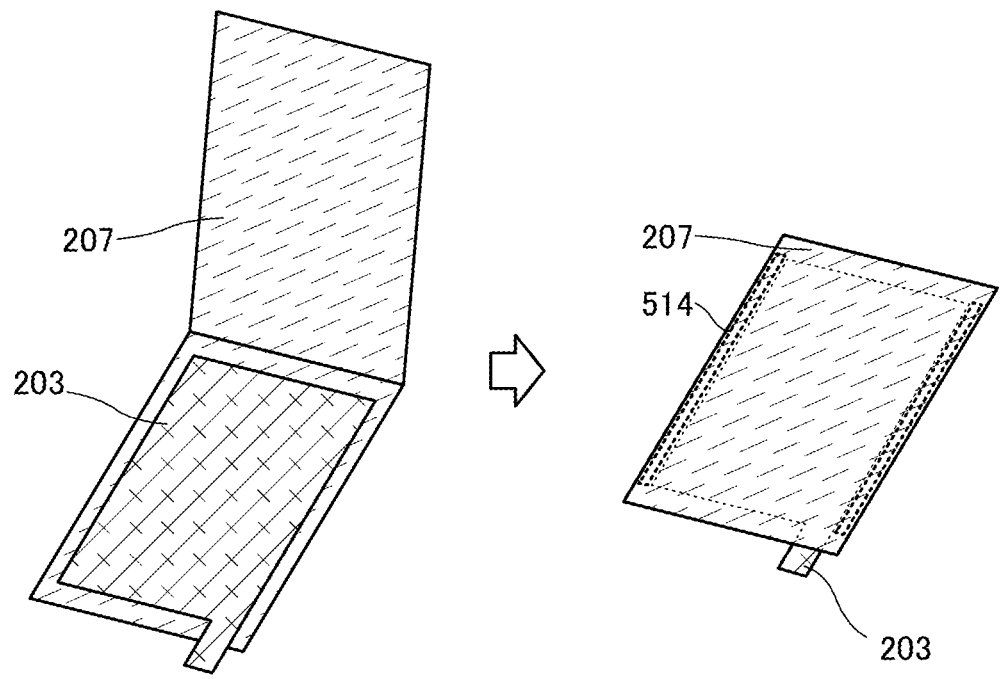
FIGS. 21A and 21B illustrate a method for manufacturing a thin storage battery.

The separator 207 is preferably formed to have a bag-like shape to surround one of the positive electrode 203 and the negative electrode 206. For example, as illustrated in FIG. 21A, the separator 207 is folded in two so that the positive electrode 203 is sandwiched, and sealed with a sealing member 514 in a region outside the region overlapping with the positive electrode 203; thus, the positive electrode 203 can be reliably supported inside the separator 207. Then, as illustrated in FIG. 21B, the positive electrodes 203 surrounded by the separators 207 and the negative electrodes 206 are alternately stacked and provided in the exterior body 209, whereby the thin secondary battery can be formed.

Figure 22A:
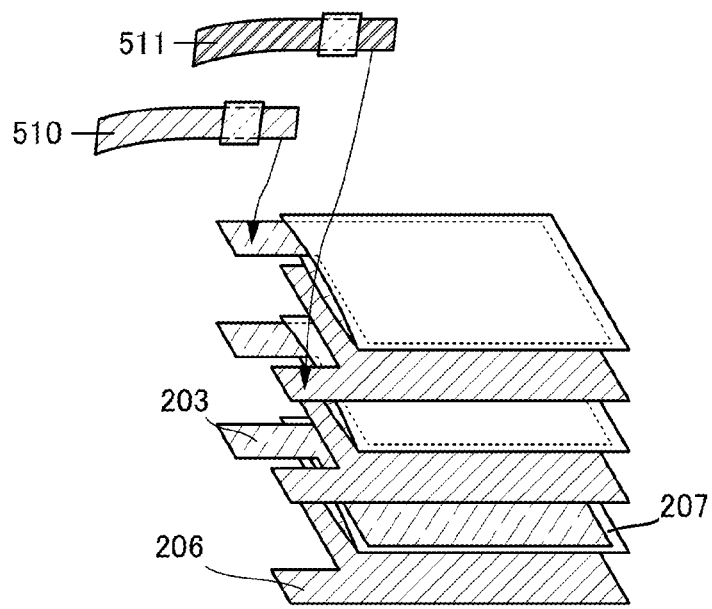
FIGS. 22A and 22B illustrate a method for manufacturing a thin storage battery.
Figure 22B:
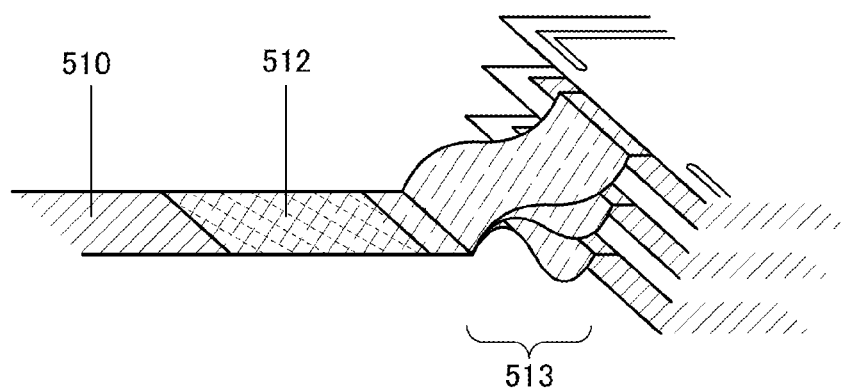

FIG. 22B illustrates an example where a current collector is welded to a lead electrode, specifically, an example where the positive electrode current collectors 201 are welded to the positive electrode lead electrode 510. The positive electrode current collectors 201 are welded to the positive electrode lead electrode 510 in a welding region 512 by ultrasonic welding or the like. The positive electrode current collector 201 includes a bent portion 513 as illustrated in FIG. 22B, and it is therefore possible to relieve stress due to external force applied after fabrication of the thin secondary battery. Thus, the thin secondary battery can have high reliability.

In the thin secondary battery illustrated in FIGS. 21A and 21B and FIGS. 22A and 22B, the positive electrode lead electrode 510 and the positive electrode current collectors 201 included in the positive electrodes 203 are welded to each other by ultrasonic welding, and the negative electrode lead electrode 511 and the negative electrode current collectors 204 included in the negative electrodes 206 are welded to each other by ultrasonic welding. The positive electrode current collector 201 and the negative electrode current collector 204 can double as terminals for electrical contact with the outside. In that case, the positive electrode current collector 201 and the negative electrode current collector 204 may be arranged so that part of the positive electrode current collector 201 and part of the negative electrode current collector 204 are exposed to the outside the exterior body 209 without using lead electrodes.

Figure 21B:
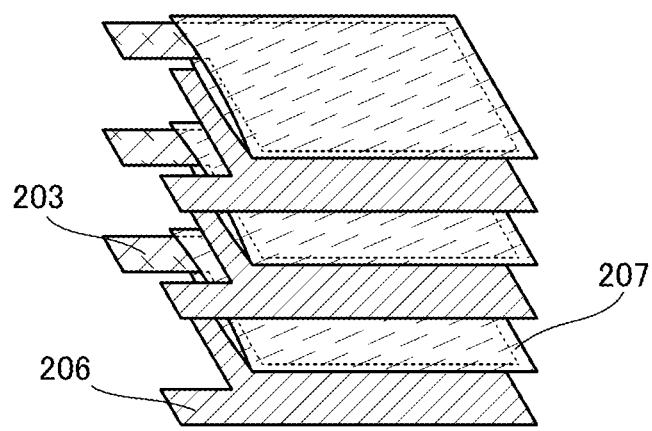
Figure 23:
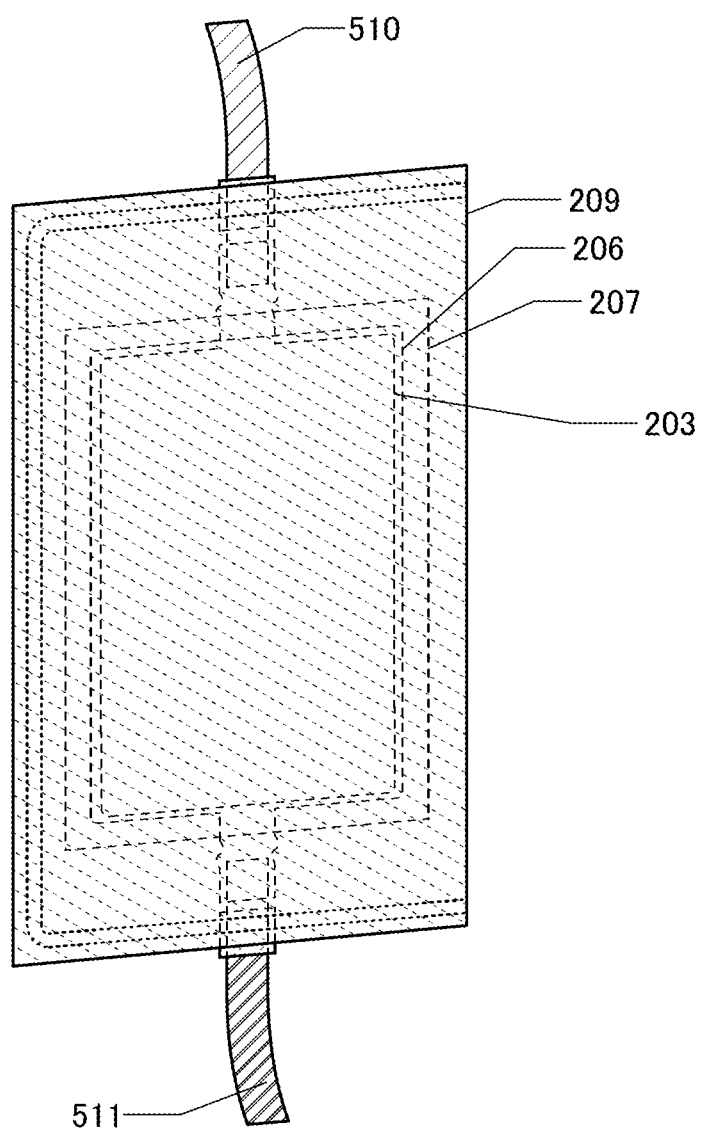
FIG. 23 illustrates a method for manufacturing a thin storage battery.

Although the positive electrode lead electrode 510 and the negative electrode lead electrode 511 are provided on the same side in FIGS. 21A and 21B, the positive electrode lead electrode 510 and the negative electrode lead electrode 511 may be provided on different sides as illustrated in FIG. 23. The lead electrodes of a storage battery of one embodiment of the present invention can be freely positioned as described above; therefore, the degree of freedom in design is high. Accordingly, a product including a storage battery of one embodiment of the present invention can have a high degree of freedom in design. Furthermore, an yield of products each including a storage battery of one embodiment of the present invention can be increased.

As the exterior body 209 in the thin storage battery 200, for example, a film having a three-layer structure in which a highly flexible metal thin film of aluminum, stainless steel, copper, nickel, or the like is provided over a film formed of a material such as polyethylene, polypropylene, polycarbonate, ionomer, or polyamide, and an insulating synthetic resin film of a polyamide-based resin, a polyester-based resin, or the like is provided as the outer surface of the exterior body over the metal thin film can be used.

The example in FIGS. 21A and 21B includes five positive electrode-negative electrode pairs (the positive and negative electrodes of each pair face each other). It is needless to say that the number of pairs of electrodes is not limited to five, and may be more than five or less than five. In the case of using a large number of electrode layers, the storage battery can have high capacity. In contrast, in the case of using a small number of electrode layers, the storage battery can have a small thickness and high flexibility.

In the above structure, the exterior body 209 of the secondary battery can change its form with a radius of curvature greater than or equal to 30 mm, preferably greater than or equal to 10 mm. One or two films are used as the exterior body of the secondary battery. In the case where the secondary battery has a layered structure, the secondary battery has a cross section sandwiched by two curved surfaces of the films when it is bent.

Figure 24A:
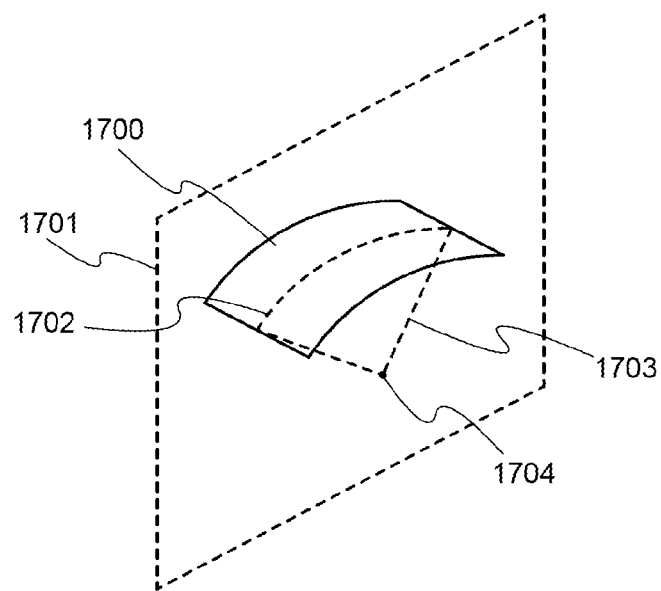
FIGS. 24A to 24C illustrate a radius of curvature of a surface.
Figure 24B:
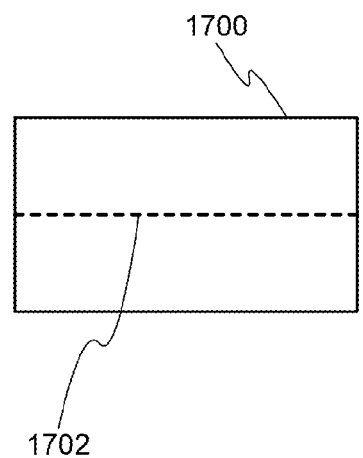
Figure 24C:
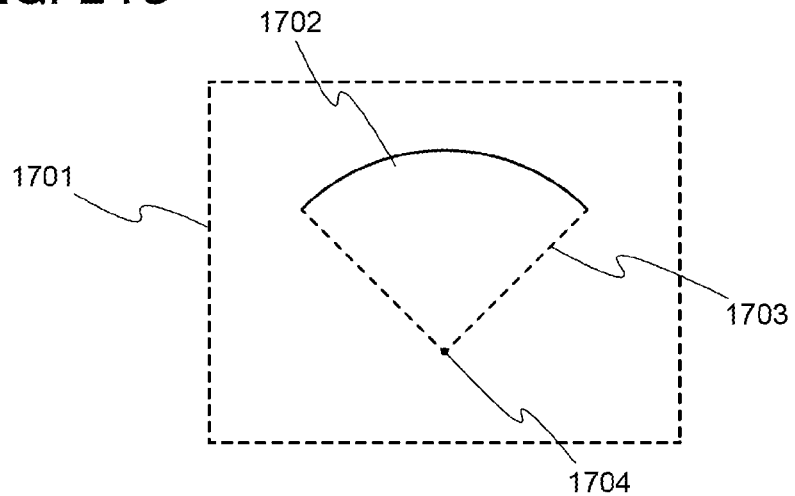

Description is given of the radius of curvature of a surface with reference to FIGS. 24A to 24C. In FIG. 24A, on a plane 1701 along which a curved surface 1700 is cut, part of a curve 1702 of the curved surface 1700 is approximate to an arc of a circle, and the radius of the circle is referred to as a radius 1703 of curvature and the center of the circle is referred to as a center 1704 of curvature. FIG. 24B is a top view of the curved surface 1700. FIG. 24C is a cross-sectional view of the curved surface 1700 taken along the plane 1701. When a curved surface is cut by a plane, the radius of curvature of a curve in a cross section differs depending on the angle between the curved surface and the plane or on the cut position, and the smallest radius of curvature is defined as the radius of curvature of a surface in this specification and the like.

Figure 25A:
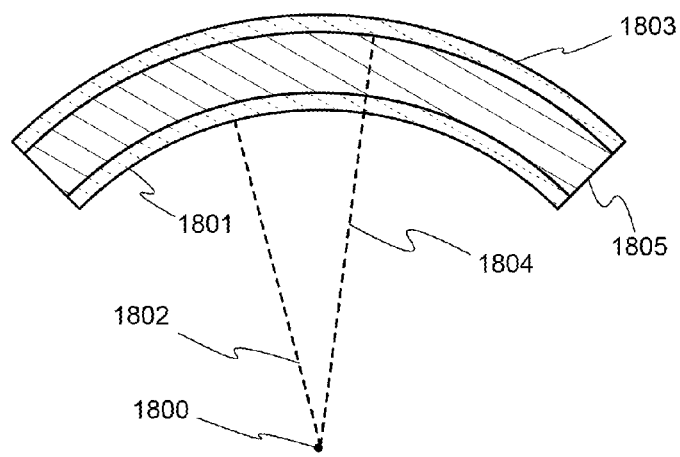
FIGS. 25A to 25D illustrate a radius of curvature of a film.
Figure 25B:
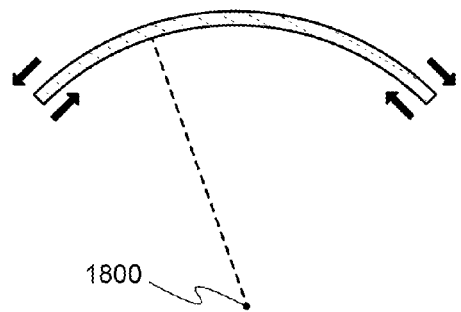

In the case of bending a secondary battery in which a component 1805 including electrodes and an electrolytic solution is sandwiched between two films as exterior bodies, a radius 1802 of curvature of a film 1801 close to a center 1800 of curvature of the secondary battery is smaller than a radius 1804 of curvature of a film 1803 far from the center 1800 of curvature (FIG. 25A). When the secondary battery is curved and has an arc-shaped cross section, compressive stress is applied to a surface of the film on the side closer to the center 1800 of curvature and tensile stress is applied to a surface of the film on the side farther from the center 1800 of curvature (FIG. 25B). However, by forming a pattern including projections or depressions on surfaces of the exterior bodies, the influence of a strain can be reduced to be acceptable even when compressive stress and tensile stress are applied. For this reason, the secondary battery can change its form such that the exterior body on the side closer to the center of curvature has a curvature radius greater than or equal to 30 mm, preferably greater than or equal to 10 mm.

Figure 25C:
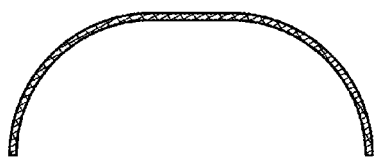
Figure 25D:

Note that the cross-sectional shape of the secondary battery is not limited to a simple arc shape, and the cross section can be partly arc-shaped; for example, a shape illustrated in FIG. 25C, a wavy shape illustrated in FIG. 25D, or an S shape can be used. When the curved surface of the secondary battery has a shape with a plurality of centers of curvature, the secondary battery can change its form such that a curved surface with the smallest radius of curvature among radii of curvature with respect to the plurality of centers of curvature, which is a surface of the exterior body on the side closer to the center of curvature, has a curvature radius greater than or equal to 30 mm, preferably greater than or equal to 10 mm.

Aging is preferably performed after fabrication of a secondary battery. The aging can be performed under the following conditions, for example. Charge is performed at a rate of 0.001 C or more and 0.2 C or less at a temperature higher than or equal to room temperature and lower than or equal to 40° C. In the case where an electrolytic solution is decomposed and a gas is generated and accumulated in the cell, the electrolytic solution cannot be in contact with a surface of the electrode in some regions. That is to say, an effectual reaction area of the electrode is reduced and effectual current density is increased.

When the current density is too high, a voltage drop occurs depending on the resistance of the electrode, and deposition of lithium on the surface of the active material proceeds in parallel with the intercalation of lithium into the active material. The lithium deposition might reduce capacity. For example, if a coating film or the like grows on the surface after lithium deposition, lithium deposited on the surface cannot be dissolved. This lithium cannot contribute to capacity. In addition, when deposited lithium is physically collapsed and conduction with the electrode is lost, the lithium also cannot contribute to capacity. Therefore, the gas is preferably released before the potential of the electrode reaches the potential of lithium because of a voltage drop.

After the release of the gas, the charging state may be maintained at a temperature higher than room temperature, preferably higher than or equal to 30° C. and lower than or equal to 60° C., more preferably higher than or equal to 35° C. and lower than or equal to 60° C. for, for example, 1 hour or more and 100 hours or less. In the initial charge, an electrolytic solution decomposed on the surface forms a coating film. The formed coating film may thus be densified when the charging state is held at a temperature higher than room temperature after the release of the gas, for example.

Here, in the case where the thin storage battery 200 is bent, it is preferably bent after the release of the gas. By bending the thin storage battery 200 after the release of the gas, for example, lithium deposition in a region to which stress is applied due to the bending or the like can be prevented.

[Coin-Type Storage Battery]

Figure 26A:
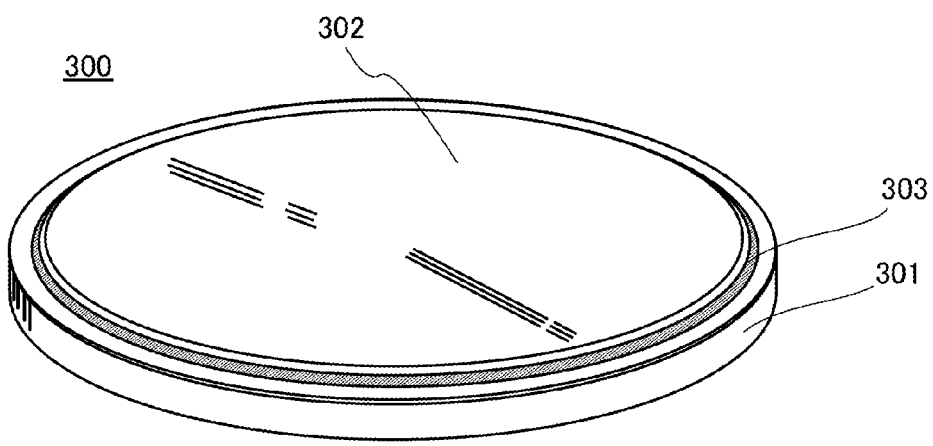
FIGS. 26A and 26B illustrate a coin-type storage battery.
Figure 26B:
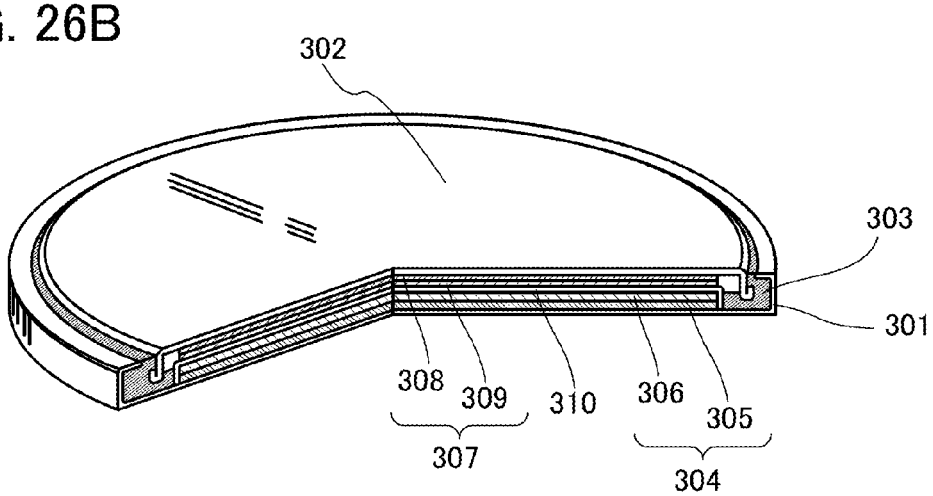

Next, an example of a coin-type storage battery will be described as an example of a power storage device with reference to FIGS. 26A and 26B. FIG. 26A is an external view of a coin-type (single-layer flat type) storage battery, and FIG. 26B is a cross-sectional view thereof.

In a coin-type storage battery 300, a positive electrode can 301 doubling as a positive electrode terminal and a negative electrode can 302 doubling as a negative electrode terminal are insulated from each other and sealed by a gasket 303 made of polypropylene or the like. A negative electrode 307 includes a negative electrode current collector 308 and a negative electrode active material layer 309 provided in contact with the negative electrode current collector 308. The negative electrode active material layer 309 includes the negative electrode active material described in Embodiment 1. For the negative electrode 307, the negative electrode described in Embodiment 2 is preferably used.

A positive electrode 304 includes a positive electrode current collector 305 and a positive electrode active material layer 306 provided in contact with the positive electrode current collector 305. The description of the positive electrode active material layer 202 can be referred to for the positive electrode active material layer 306. The description of the separator 207 can be referred to for the separator 310. The description of the electrolytic solution 208 can be referred to for the electrolytic solution.

Note that only one surface of each of the positive electrode 304 and the negative electrode 307 used for the coin-type storage battery 300 is provided with an active material layer.

For the positive electrode can 301 and the negative electrode can 302, a metal having a corrosion-resistant property to an electrolytic solution, such as nickel, aluminum, titanium, an alloy of such metals, and an alloy of such a metal and another metal (e.g., stainless steel) can be used. Alternatively, the positive electrode can 301 and the negative electrode can 302 are preferably covered with nickel, aluminum, or the like in order to prevent corrosion due to the electrolytic solution. The positive electrode can 301 and the negative electrode can 302 are electrically connected to the positive electrode 304 and the negative electrode 307, respectively.

The negative electrode 307, the positive electrode 304, and the separator 310 are immersed in the electrolytic solution. Then, as illustrated in FIG. 26B, the positive electrode 304, the separator 310, the negative electrode 307, and the negative electrode can 302 are stacked in this order with the positive electrode can 301 positioned at the bottom, and the positive electrode can 301 and the negative electrode can 302 are subjected to pressure bonding with the gasket 303 interposed therebetween. In such a manner, the coin-type storage battery 300 can be manufactured.

This embodiment can be implemented in appropriate combination with any of the other embodiment.

This application is based on Japanese Patent Application serial no. 2014-180889 filed with Japan Patent Office on Sep. 5, 2014, the entire contents of which are hereby incorporated by reference.

What is claimed is:

1. An electronic device comprising:
   a housing comprising:
     a first board;
     a second board; and
     a sealing portion;
   a flexible display portion; and
   a power storage device, wherein the first board has a light-transmitting property, wherein the first board and the second board face each other, wherein the sealing portion is positioned between the first board and the second board, wherein the first board has a first curved surface which forms an inside of the housing, wherein the flexible display portion includes a region in contact with the first curved surface, and wherein the power storage device comprises a region in contact with the first curved surface.

2. The electronic device according to claim 1, wherein each of the first board, the second board and the sealing portion has flexibility.

3. The electronic device according to claim 1, wherein part of the sealing portion has a surface which is substantially continuous with a surface of the second board, the surface of the second board forming an outside of the housing.

4. The electronic device according to claim 1, wherein the sealing portion is in contact with the first board and the second board.

5. The electronic device according to claim 1, wherein the sealing portion comprises a resin.

6. The electronic device according to claim 1, wherein the sealing portion comprises a material with elasticity.

7. The electronic device according to claim 1, wherein the sealing portion has higher flexibility than the first board.

8. The electronic device according to claim 1, wherein the power storage device comprises a region in contact with the second board.

9. The electronic device according to claim 1, wherein the electronic device is worn on an arm of a user.

10. An electronic device comprising:
a first board;
a second board;
a sealing portion;
a display portion having flexibility; and
a power storage device, wherein the first board has a light-transmitting property, wherein the first board and the second board face each other, wherein the sealing portion is positioned between the first board and the second board, and wherein the first board is in contact with the display portion and the power storage device.

11. The electronic device according to claim 10, wherein the electronic device is worn on an arm of a user.

12. The electronic device according to claim 10, wherein each of the first board, the second board and the sealing portion has flexibility.

13. The electronic device according to claim 10, further comprising a housing, wherein the housing comprises a substantially continuous surface, and wherein the substantially continuous surface comprises the first board, the second board and the sealing portion.

14. The electronic device according to claim 10, wherein the sealing portion is in contact with the first board and the second board.

15. The electronic device according to claim 10, wherein the sealing portion comprises a resin.

16. The electronic device according to claim 10, wherein the sealing portion comprises a material with elasticity.

17. The electronic device according to claim 10, wherein the sealing portion has higher flexibility than the first board.

18. The electronic device according to claim 10, wherein the power storage device comprises a region is in contact with the second board.

* * * * *